United States Patent

O'Hara et al.

Patent Number: 5,482,789
Date of Patent: Jan. 9, 1996

[54] NICKEL BASE SUPERALLOY AND ARTICLE

[75] Inventors: Kevin S. O'Hara, Boxford, Mass.; William S. Walston, Maineville, Ohio; Earl W. Ross, Cincinnati, Ohio; Ramgopal Darolia, W. Chester, Ohio

[73] Assignee: General Electric Company, Cincinnati, Ohio

[21] Appl. No.: 176,613

[22] Filed: Jan. 3, 1994

[51] Int. Cl.$^6$ ............................ C22C 19/05; B32B 15/00
[52] U.S. Cl. ........................ 428/652; 428/670; 428/680; 148/404; 148/410; 148/428
[58] Field of Search ................................ 428/652, 670, 428/680; 148/404, 410, 428; 420/443, 445

[56] References Cited

U.S. PATENT DOCUMENTS

| | | | |
|---|---|---|---|
| 4,719,080 | 1/1988 | Duhl et al. | 420/445 |
| 4,935,072 | 6/1990 | Nguyen-Dinh | 148/404 |
| 5,151,249 | 9/1992 | Austin et al. | 148/404 |
| 5,270,123 | 12/1993 | Walston et al. | 148/404 |

*Primary Examiner*—Deborah Yee
*Attorney, Agent, or Firm*—Andrew C. Hess; David L. Narciso

[57] ABSTRACT

The present invention provides a nickel base superalloy having an improved combination of stress rupture life and microstructural stability with respect to the formation of TCP phases. A unique feature is the specific combination of the content of elements consisting of Al, Ti and W in a second range defined by their sum in a nickel base superalloy having high contents of rhenium, in excess of 1.3 atomic percent (about 4.0 weight percent) to lower the propensity for TCP phase formation and thus render the alloy more stable at high temperatures. The interaction of Ru with the remaining elements to modify the refractory element phase partitioning provides unique capabilities, causing elements to partition to the gamma phase or the gamma prime phase in a reverse direction than normally experienced in Ni-base superalloys. These Ni-base superalloys are termed Ru-containing Reverse Partitioning Ni-base Superalloys. The composition of these Reverse Partitioning Ni-base superalloys is in the range, in atomic percent, of 1.3–3% Re, 2.0–3.7% Ta, 4.0–18.0% Co, 0–0.2% Hf, 0–0.3% C, 0–0.05% B, 0–0.03% Y, 0–2.0% Mo, 1.5–7.2% Cr, 0–0.3% Cb, 12.0–15.0% Al, 0–1.3% Ti, 1.0–2.5% W, in combination with 0.25–4.0 Ru and the balance Ni and incidental impurities.

9 Claims, 12 Drawing Sheets

FIG. 1  TCP = 0  200X

FIG. 2  TCP = 5  200X

FIG. 3  TCP = 10  200X

ALLOY 10
2100F/12ksi
200X

ALLOY 7
2000F/18ksi
503.9 hrs.
200X

ALLOY 7
2100F/12ksi
755.5 hrs.
200X

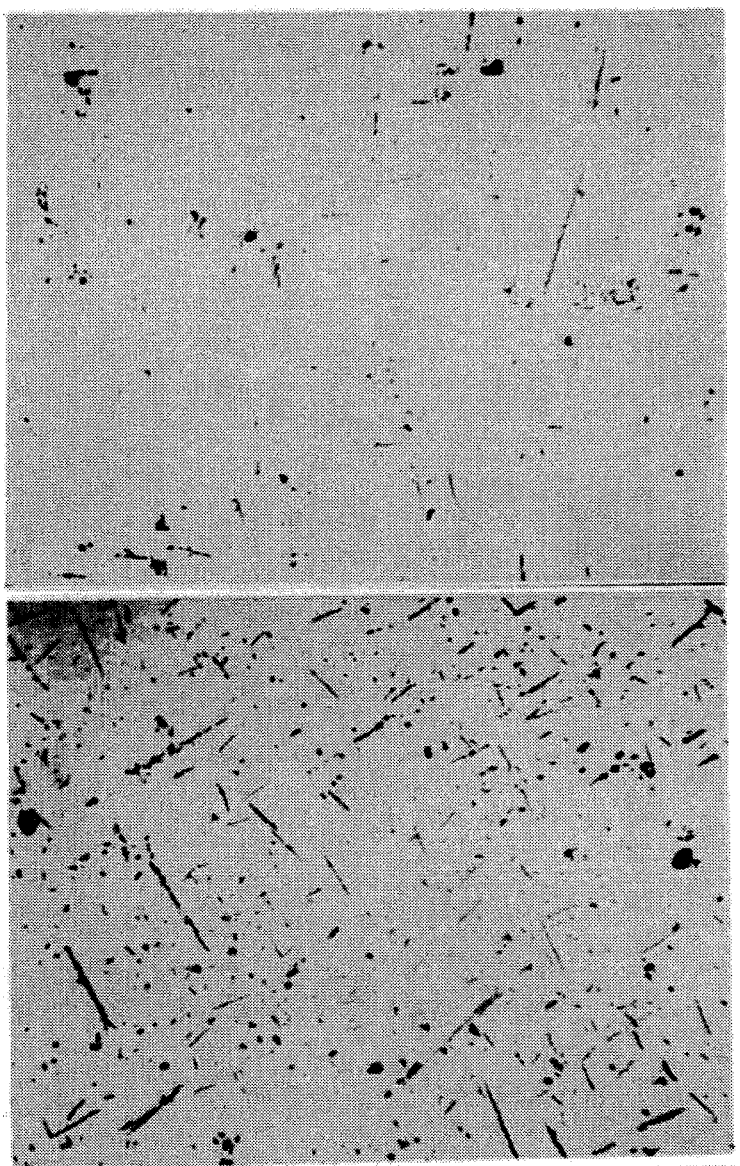
ALLOY 9
2000F/18ksi
556.2 hrs.
200X
FIG. 12
ALLOY 9
2100F/12ksi
497.9 hrs.
200X
FIG. 13
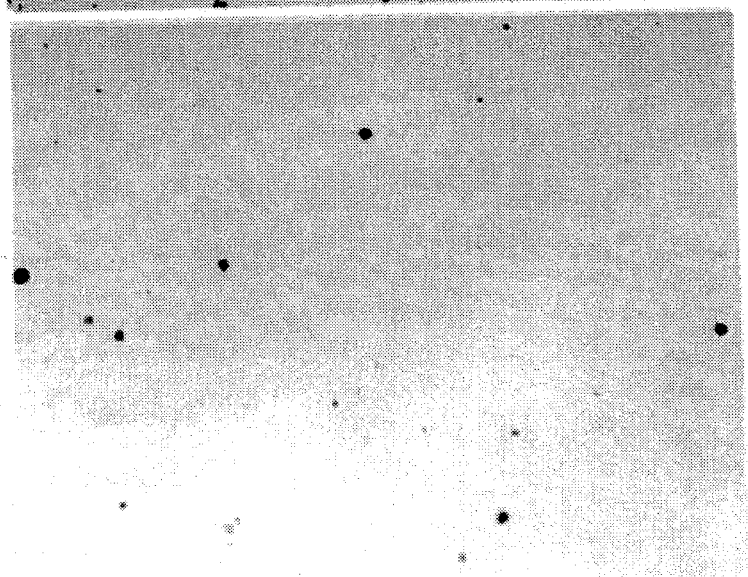
ALLOY 7
2000F/18ksi
503.9 hrs.
200X
FIG. 14

ALLOY 7
2100F/12ksi
755.5 hrs.
200X

ALLOY 13
2000F/18ksi
374.1 hrs.
200X

ALLOY 13
2100F/12ksi
299.7 hrs.
200X

ALLOY 11
2000F/18ksi
618.2 hrs.
200X

ALLOY 11
2100F/12ksi
858.2 hrs.
200X

ALLOY 9
2000F/18ksi
556.2 hrs.
200X

ALLOY 9
2100F/12ksi
497.9 hrs.
200X

ALLOY 26
1444/4 w/o Re
+ 0 w/o Ru
2000F/16ksi
Life=86 hrs.
200X

ALLOY 27
1444/4 w/o Re
+ 1.5 w/o Ru
2000F/16ksi
Life=163.1 hrs.
200X

ALLOY 28
1444/4 w/o Re
+ 3.0 w/o Ru
2000F/16ksi
Life=297.0 hrs.
200X

ALLOY 29
R'162/+0.5 w/o
Al + 0 w/o Ru
2000F/18ksi
Life=490 hrs.
200X

ALLOY 30
R'162/+0.5 w/o
Al + 1.5 w/o Ru
2000F/18ksi
Life=375 hrs.
200X

ALLOY 31
R'162/+0.5 w/o
Al + 3.0 w/o Ru
2000F/18ksi
Life=317.2 hrs.
200X

NICKEL BASE SUPERALLOY AND ARTICLE

CROSS REFERENCE TO RELATED APPLICATION

This invention is related to U.S. Pat. No. 5,270,123, issued Dec. 14, 1993 and U.S. patent application Ser. No. 08/100,010 filed Jul. 29, 1993, (Docket No. 13DV-11972-Walston et al.), which is related to U.S. Pat. No. 5,151,249, all of which are assigned to the same assignee of this application. The disclosure of such copending applications are hereby incorporated herein by reference.

BACKGROUND OF THE INVENTION

This invention relates to nickel base superalloys and, more particularly, to such alloys for use as single crystal articles at elevated temperatures of about 2000° F. and above.

A number of high temperature nickel base superalloys have been developed and reported for use in the form of single crystal articles at high temperature under severe lcad conditions. For example, such conditions exist in the turbine section of advanced gas turbine engines for aircraft use. Such single crystal articles are useful as airfoils in these turbine sections.

In general, the recent advances in alloy strength for single crystal articles useful at such high temperatures and severe lcad conditions have been accomplished by the incorporation of "heavy" refractory elements into the alloy, which inhibit the atomic diffusion process. These refractory elements include rhenium (Re), tungsten (W), tantalum (Ta), and molybdenum (Mo). Unfortunately these alloying additions of rhenium, tungsten, molybdenum and tantalum cannot be made to strengthen such nickel base superalloy articles without rendering the alloy more susceptible to the precipitation of undesirable phases. Especially detrimental are phases known as the topologically close packed (TCP) phases which form after exposure at temperatures above about 1800° F. TCP phases are not only brittle, but their formation reduces solution strengthening potential of the alloy by removing solute elements from the desired alloy phases and concentrating them in the brittle phases so that intended strength and life goals are not met.

GE PROPRIETARY INFORMATION

Generally, articles intended for elevated temperature and long life duration in turbine machinery are coated with an environmental protection coating because of the severe oxidizing conditions during operation. One element frequently included in such a coating is aluminum, sometimes in combination or alloyed with other elements such as platinum. It has been recognized, however, that even though some reported nickel base superalloys have adequate strength as single crystal articles for such strenuous conditions, such protective coatings can interdiffuse with the article surface to develop or precipitate undesirable TCP phases at or near the coating-base metal interface. This coating-base metal reaction can also result in loss of mechanical properties during engine operation and is considered highly undesirable.

Dinh has observed, in U.S. Pat. No. 4,935,072 that there is a lesser tendency for an alloy to form the undesirable sigma phase when ruthenium is present in the alloy. The sigma phase is but one structure of the undesirable TCP family. The narrow range of alloys covered by Dinh is restricted to alloys having a rhenium content of less than 3.5 weight percent, hereinafter designated as w/o, and in which ruthenium is preferably not utilized in the alloy. Dinh, when utilizing the optional ruthenium, teaches the substitution of ruthenium for rhenium. The Dinh patent discloses a narrow range of alloys in which only the sigma phase is observed. In superalloys having higher rhenium levels, more complicated stability relationships are observed, and multiple TCP phases are present including P-phase, mu phase and to a lesser extent sigma. These TCP phases in alloys having rhenium in ranges above the ranges taught by Dinh exhibit higher rhenium content as compared to the Re content of the sigma phases observed in Dinh. It would appear that at rhenium levels above the levels taught by Dinh, there is additional partitioning of rhenium to the TCP phases. This affects the nature of the TCP phases and is responsible for the different stability behavior observed in alloys having higher rhenium levels. The alloys taught by Dinh have lower rhenium levels.

Duhl et al., in U.S. Pat. No. 4,719,080 teaches a nickel base superalloy including both rhenium and ruthenium, but as optional elements. Duhl fails to disclose the formation of TCP phases in any of the observed forms such as sigma phase, P-phase or the mu phase. Thus, Duhl could not recognize the critical role of rhenium in the formation of these undesirable TCP phases, nor could Duhl offer suggestions to solve the unrecognized problem.

Austin et al., in U.S. Pat. No. 5,151,249, teaches a nickel base superalloy including rhenium and, optionally ruthenium. Austin et al. recognized, like Duhl et al., that rhenium is a potent solid solution strengthening element. However, Austin further recognized that at high rhenium levels, above about 8 w/o, there is an increased tendency to form TCP phases during exposure at elevated temperatures. But Austin et al., like Duhl et al., did not appreciate the role of ruthenium in preventing the formation of TCP phases, teaching the addition only as an optional element, and thus lacks the teaching of the criticality of ruthenium in combination with other elements to control TCP phase formation at elevated temperatures.

What is desired is a nickel base superalloy having adequate strength at elevated temperatures, but which has a reduced tendency to form undesirable TCP phases, particularly at coating base metal interfaces after exposure at elevated temperatures.

SUMMARY OF THE INVENTION

The present invention, in one form, provides a nickel base superalloy having an improved combination of stress rupture life and microstructural stability with respect to the formation of TCP phases. The formation of undesirable topologically close packed (TCP) phases beyond small nominal amounts, is affected by the composition and thermal history of the alloy, and once formed, invariably reduces the rupture life capability of the alloy. A unique feature of the present invention is the specific combination of the content of the elements ruthenium (Ru), tantalum (Ta) along with a first group of elements consisting of Mo, Cr and Cb in a first range defined by their sum and a second group of elements consisting of Al, Ti and W in a second range defined by their sum in a nickel base superalloy having high contents of rhenium, in excess of 1.3 atomic %, hereinafter a/o (about 4.0 weight percent) to lower the propensity for TCP phase formation and thus render the alloy more stable at high temperatures. The interaction of Ru with the remaining elements to modify the refractory element phase partitioning provides the heretofore unknown and unique capabilities of the nickel base superalloys of the present invention, causing elements to partition to the gamma phase or the gamma prime phase in a reverse direction than normally experienced in Ni-base superalloys. These Ni-base superalloys are termed Ru-containing Reverse Partitioning Ni-base Superalloys. In one embodiment of Reverse Partitioning Ni-base superalloys, the composition of a single crystal article having a gamma phase and a gamma prime phase, is in the range, in atomic percent, of 1.3–3% Re, 2.0–3.7% Ta, 4.0–18.0% Co, 0–0.2% Hf, 0–0.3% C, 0–0.05% B, 0–0.03% Y, 0–2.0% Mo, 1.5–7.2% Cr, 0–0.7% Cb, 12.0–15.0% Al, 0–1.3% Ti, 1.0–2.5% W, in combination with 0.25–4.0 Ru and the balance Ni and incidental impurities. In this Ni-base superalloy article, Ru substantially substitutes for Al and optional Ti in the gamma prime phase while partitioning Al and optional Ti to the gamma phase. The Ru also causes W, Cr and Re to be partitioned to the gamma prime phase. The nickel base superalloy article is characterized by an improved combination of stress rupture life and microstructural stability in which the detrimental formation of topologically close packed phases, which phases are a gamma precipitate, is minimized in the superalloy microstructure at elevated temperatures, substantially due to the reverse partitioning effect of the TCP-forming elements to the gamma prime phase in the presence of ruthenium.

This invention also encompasses a single crystal article having an improved combination of stress rupture life and microstructural stability and which minimizes the detrimental formation of topologically close packed phases in the superalloy microstructure at elevated temperatures, the superalloy single crystal article being characterized by a specific combination of Ru with a first group of elements consisting of Mo, Cr and Cb in a first range defined by their sum in atomic percent, and a second group of elements consisting of Al, Ti and W in a second range defined by their sum in atomic percent, the composition of the superalloy article consisting essentially of, in atomic percent, 0.25–4.0% Ru, in combination with 1.3–2.6% Re, 2.0–3.7% Ta, 4.0–16.0% Co, 0–0.16% Hf, 0–0.3% C, 0–0.05% B, 0–0.03% Y, 0–2.0% Mo, 1.5–7.2% Cr, 0–0.7% Cb, 12.0–15.0% Al, 0–1.3

Ti, 1.0–2.3% W, wherein the sum of the first range, defined by the first group of elements consisting of Mo+Cr+Cb, is 1.5–8.0%, and wherein the sum of the second range, defined by the second group of elements consisting of Al+Ti+W, is 13.5–17.2%, the balance Ni and incidental impurities.

The nickel base superalloy single crystal article of the present invention has an improved combination of stress rupture life and microstructural stability and minimizes the detrimental formation of topologically close packed phases in the superalloy microstructure at elevated temperatures.

In one form, the superalloy single crystal article is characterized by a specific combination of Ru with a first group of elements consisting of Mo, Cr and Cb in a first range defined by their sum in atomic percent, and a second group of elements consisting of Al, Ti and W in a second range defined by their sum in atomic percent, the composition of the superalloy article consisting essentially of, in atomic percent, 0.25–4.0% Ru, in combination with 1.3–2.6% Re, 2.0–3.7% Ta, 4.0–16.0% Co, 0–0.16% Hf, 0–0.3% C, 0–0.05% B, 0–0.03% Y, 0–2.0% Mo, 1.5–7.2% Cr, 0–0.7% Cb, 12.0–15.0% Al, 0–1.3% Ti, 1.0–2.3% W, wherein the sum of the first range, defined by the first group of elements consisting of Mo+Cr+Cb, is 1.5–8.0%, and wherein the sum of the second range, defined by the second group of elements consisting of Al+Ti+W, is 13.5–17.2%, the balance Ni and incidental impurities and wherein the alloy is characterized by a stress rupture life of at least about 360 hours under a stress in the range of at least about 11–18 ksi at a temperature in the range of 2000° F.–2100° F. Preferably, the stress rupture life or the article is at least 600 hours under a stress of at least about 12 ksi at a temperature of at least about 2100° F. The alloys of the present invention are stable, in that they do not have a propensity to form TCP phases. The propensity to form TCP phases is quantified by the present invention in terms of TCP number, with a higher TCP number meaning a greater propensity to form unstable TCP. A TCP number of 3 or less is acceptable for alloys of the present invention. Superalloy articles of the present invention are most useful as airfoils for gas turbine engines. Because such airfoil articles are coated with Al alloys, Pt alloys and combinations of these alloys which have a tendency to form secondary reaction zones (SRZ) at the coating substrate interface, the alloy compositions comprising the articles of the present invention also have a tendency to inhibit SRZ formation as compared to existing superalloy articles used as, for example, airfoils.

For the purposes of this disclosure, the term "incidental impurities" is meant to include small amounts of impurities and incidental elements, which in character and/or amount do not adversely affect the advantageous aspects of the superalloy.

In another form, the present invention provides a strong, stable nickel base single crystal superalloy article having an improved combination of stress rupture life and microstructural stability as a result of being made from the above identified alloy of the present invention. This article is characterized by the substantial absence of a secondary reaction zone internally of the article after exposure at about 2000° F. for about 1000 hours under a stress of about 15 ksi (thousands of pounds per square inch), and a stress rupture life of at least about 600 hours under a stress in the range of about 11 ksi at a temperature in the range of 2100° F. with a TCP number of about 3.0 or less. The TCP number is an analytical value based on alloy composition utilized to predict TCP phase precipitation. High TCP numbers indicate a propensity to form TCP phases. TCP numbers of 3 or less are required for acceptable stress rupture life. Because the science of chemistry and phase formation rests on the atomic basis and with atomic formulations and since the literature of TCP formulation in nickel base superalloys also utilizes atomic formulations, most of the experimentation leading to the discoveries of the present invention were analyzed in atomic percent (a/o) and are presented herein as such. Because some of the prior art reports compositions in weight percent, when feasible the approximate weight percent is presented herein parenthetically after the atomic percent as weight % or (w/o).

BRIEF DESCRIPTION OF THE DRAWINGS

The subject matter which is regarded as the invention is particularly pointed out and distinctly claimed in the concluding portion of the specification. The invention itself, however, both as to its organization and its method of practice, together with further objects and advantages thereof, may best be understood by the following description taken in conjunction with the accompanying drawings, in which:

FIGS. 1–3 are a series of photomicrographs showing some of the microstructural standards for rating an alloy's TCP phase incidence after elevated temperature, stressed exposure with FIG. 1 having a TCP rating of 0, FIG. 2 having a TCP rating of 5 and FIG. 3 having a TCP rating of 10;

FIGS. 12 and 13 are photomicrographs of Alloy 9 after stress rupture testing at 2000° F./18 ksi and 2100° F./12 ksi respectively;

FIGS. 14 and 15 are photomicrographs of Alloy 7 after stress rupture testing at 2000° F./18 ksi and 2100° F./12 ksi respectively;

DETAILED DESCRIPTION OF THE PREFERRED EMBODIMENTS

Figure 4:
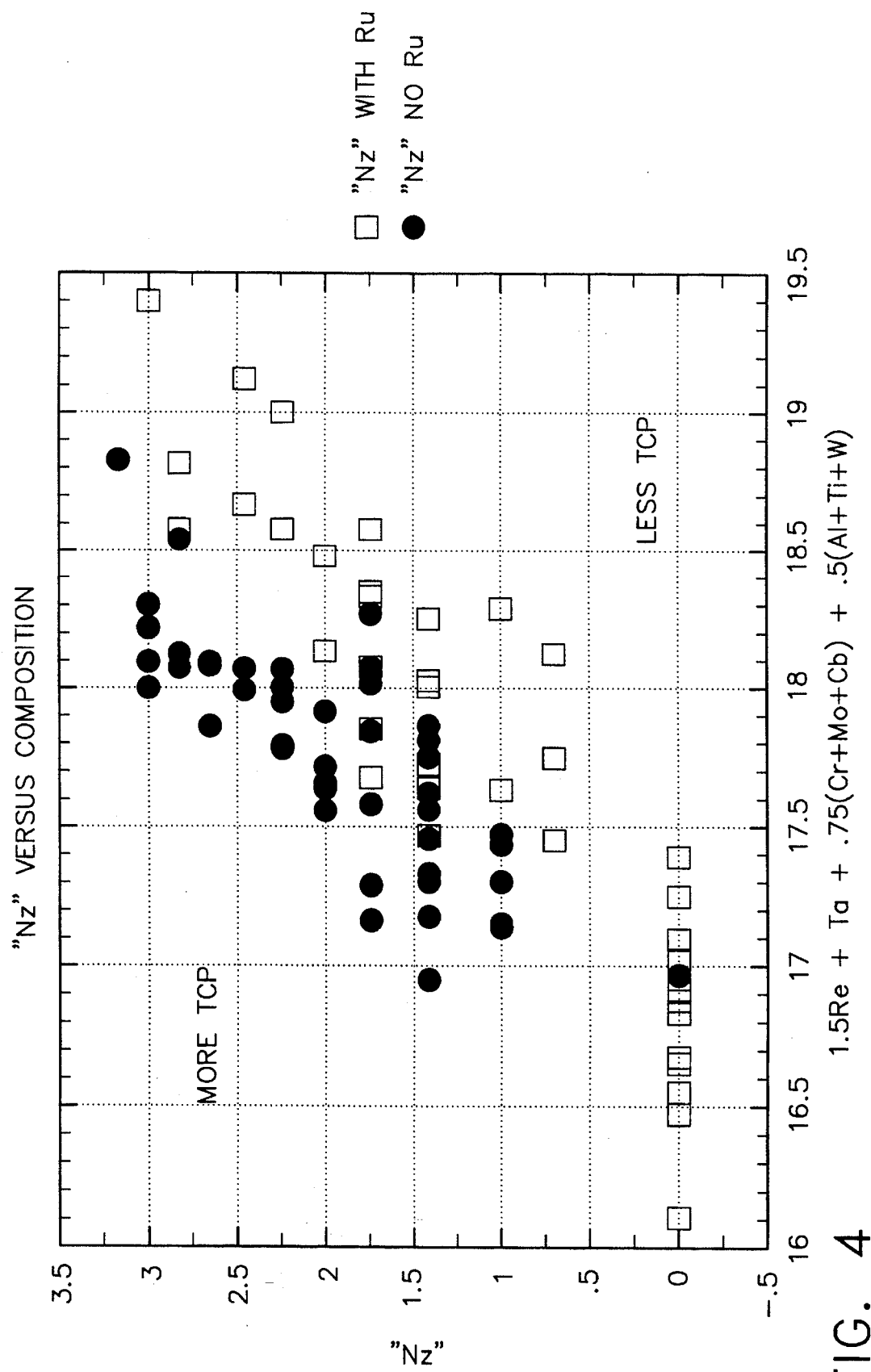
FIG. 4 is a graph of $N_z$ versus composition, which shows the correlation of TCP phase formation with composition, and the beneficial effect of Ruthenium on composition.

One reported nickel-base single crystal superalloy, referred to as R'162, is described in U.S. Pat. No. 5,151,249—Austin et al, patented Sept. 29, 1992, previously discussed, and assigned to the assignee of this invention. The alloy of that patent is a very strong single crystal superalloy. However, for certain high temperature applications, it was found to have undesirable microstructural instability when coated with a certain type of environmental protective coating, particularly one including the element aluminum.

Another nickel-base superalloy particularly developed for use as a single crystal article is described in U.S. Pat. No. 5,270,123 issued Dec. 14, 1993, also previously discussed. That alloy sacrificed a small amount of stress rupture capability for a significant increase in microstructural stability in respect to the constituent identified as secondary reaction zone (SRZ), particularly in the body of the alloy adjacent the coating, for certain selected uses. This was accomplished through a unique combination of Re in the presence of Al, Cr, Ta, and Mo in defined ranges, in a base principally of Co, W, and Ni. However, this alloy failed to recognize the significance of Ru in controlling Re and preventing Re from preferentially partitioning to TCP phases.

The constituent termed SRZ has been observed to form in certain nickel base superalloys, especially those designed for the manufacture of single crystal structures. Typically SRZ will form at the interface between the protective coating-base/alloy interface after temperature exposures of 1800° F. and above. The formation results in the loss of mechanical properties, particularly stress rupture. The SRZ constituent consists essentially of an orthorhombic "P" phase which is a Type II topologically close-packed (TCP) phase, and a gamma phase, both dispersed in a gamma prime matrix, the TCP phase and the gamma phase form needle like structures within the blocky gamma prime matrix. On occasion SRZ has been observed to form at elevated temperatures in segregated areas of the microstructure during stress rupture testing, again resulting in reduced properties.

Continuing evaluation of these types of alloys for single crystal article use at elevated temperatures has identified a critical relationship between microstructural stability and stress rupture capability. This is especially important for uses at temperatures about 2000° F. and above where Rhenium rich TCP phases precipitate. During such evaluation it was recognized that the inclusion of the element Ru is critical in providing the combination of microstructural stability and improved stress rupture life. Table I presents the nominal compositions of representative alloys evaluated.

TABLE I

ALLOY COMPOSITIONS

| Alloy | Re | Ru | Mo | Cr | W | Co | Al | Ta | Ti | Cb | Re | Ru | Mo | Cr | W | Co | Al | Ta | Ti | Cb | Al+Ti+W | Cr+Mo+Cb |
|---|---|---|---|---|---|---|---|---|---|---|---|---|---|---|---|---|---|---|---|---|---|---|
| | (Wt %) | | | | | | | | | | (At. %) | | | | | | | | | | | |
| 1 | 5.60 | 1.50 | 0.00 | 4.50 | 5.30 | 12.70 | 6.00 | 7.30 | 0.00 | 0.00 | 1.87 | 0.92 | 0.00 | 5.37 | 1.79 | 13.37 | 13.80 | 2.50 | 0.00 | 0.00 | 15.59 | 5.37 |
| 2 | 4.70 | 1.50 | 0.93 | 4.49 | 5.29 | 12.70 | 6.00 | 7.29 | 0.00 | 0.00 | 1.56 | 0.92 | 0.60 | 5.34 | 1.78 | 13.34 | 13.76 | 2.49 | 0.00 | 0.00 | 15.55 | 5.94 |
| 3 | 4.70 | 2.48 | 0.00 | 4.49 | 5.29 | 12.69 | 6.00 | 7.28 | 0.00 | 0.00 | 1.56 | 1.52 | 0.00 | 5.35 | 1.78 | 13.33 | 13.77 | 2.49 | 0.00 | 0.00 | 15.55 | 5.35 |
| 4 | 5.55 | 2.46 | 0.92 | 4.41 | 5.21 | 12.42 | 5.88 | 7.16 | 0.00 | 0.00 | 1.86 | 1.52 | 0.60 | 5.30 | 1.77 | 13.18 | 13.63 | 2.47 | 0.00 | 0.00 | 15.40 | 5.90 |
| 5 | 4.50 | 0.80 | 0.95 | 5.00 | 5.65 | 12.65 | 6.00 | 6.40 | 0.40 | 0.00 | 1.48 | 0.49 | 0.61 | 5.89 | 1.88 | 13.15 | 13.63 | 2.17 | 0.51 | 0.00 | 16.03 | 6.50 |
| 6 | 5.40 | 0.80 | 0.95 | 5.00 | 5.65 | 12.65 | 6.00 | 7.90 | 0.00 | 0.00 | 1.81 | 0.49 | 0.62 | 6.00 | 1.92 | 13.40 | 13.88 | 2.72 | 0.00 | 0.00 | 15.80 | 6.62 |
| 7 | 5.40 | 1.60 | 0.95 | 5.00 | 5.65 | 12.65 | 6.00 | 7.90 | 0.00 | 0.00 | 1.80 | 0.99 | 0.62 | 5.98 | 1.91 | 13.36 | 13.84 | 2.72 | 0.00 | 0.00 | 15.75 | 6.60 |
| 8 | 5.40 | 1.60 | 0.95 | 5.00 | 5.65 | 12.65 | 6.00 | 6.40 | 0.40 | 0.00 | 1.80 | 0.98 | 0.61 | 5.95 | 1.90 | 13.29 | 13.77 | 2.19 | 0.52 | 0.00 | 16.19 | 6.56 |
| 9 | 5.40 | 0.80 | 1.55 | 5.00 | 5.65 | 12.65 | 6.00 | 6.40 | 0.40 | 0.00 | 1.80 | 0.49 | 1.00 | 5.98 | 1.90 | 13.34 | 13.82 | 2.19 | 0.52 | 0.00 | 16.19 | 6.98 |
| 10 | 5.40 | 0.80 | 1.55 | 5.00 | 5.65 | 12.65 | 6.00 | 6.40 | 0.40 | 0.00 | 1.79 | 0.49 | 1.00 | 5.95 | 1.89 | 13.27 | 13.75 | 2.19 | 0.52 | 0.00 | 16.17 | 6.94 |
| 11 | 5.40 | 1.60 | 1.55 | 5.00 | 5.65 | 12.65 | 6.00 | 6.40 | 0.40 | 0.00 | 1.49 | 0.98 | 1.00 | 5.93 | 1.89 | 13.23 | 13.71 | 2.18 | 0.51 | 0.00 | 16.12 | 6.92 |
| 12 | 5.40 | 1.60 | 1.55 | 5.00 | 5.65 | 12.65 | 6.00 | 7.90 | 0.00 | 0.00 | 1.82 | 0.99 | 1.01 | 6.04 | 1.93 | 13.48 | 13.96 | 2.74 | 0.00 | 0.00 | 15.89 | 7.05 |
| 13 | 4.50 | 0.80 | 0.95 | 5.90 | 5.65 | 12.65 | 6.00 | 7.90 | 0.00 | 0.00 | 1.50 | 0.49 | 0.61 | 7.03 | 1.90 | 13.29 | 13.77 | 2.70 | 0.00 | 0.00 | 15.68 | 7.64 |
| 14 | 4.50 | 0.80 | 0.95 | 5.90 | 5.65 | 12.65 | 6.00 | 6.40 | 0.40 | 0.00 | 1.50 | 0.49 | 0.61 | 6.99 | 1.89 | 13.22 | 13.70 | 2.18 | 0.51 | 0.00 | 16.11 | 7.60 |
| 15 | 4.50 | 1.60 | 0.95 | 5.90 | 5.65 | 12.65 | 6.00 | 6.40 | 0.40 | 0.00 | 1.48 | 0.97 | 0.61 | 6.97 | 1.89 | 13.19 | 13.66 | 2.17 | 0.51 | 0.00 | 16.06 | 7.58 |
| 16 | 5.40 | 1.60 | 0.95 | 5.90 | 5.65 | 12.65 | 6.00 | 7.90 | 0.00 | 0.00 | 1.81 | 0.99 | 0.62 | 6.98 | 1.91 | 13.43 | 13.91 | 2.73 | 0.00 | 0.00 | 15.83 | 7.72 |
| 17 | 4.50 | 0.80 | 1.55 | 5.90 | 5.65 | 12.65 | 6.00 | 7.90 | 0.00 | 0.00 | 1.48 | 0.49 | 0.99 | 7.10 | 1.92 | 13.43 | 13.91 | 2.73 | 0.00 | 0.00 | 15.83 | 7.72 |
| 18 | 5.40 | 0.80 | 1.55 | 5.90 | 5.65 | 12.65 | 6.00 | 6.40 | 0.40 | 0.00 | 1.81 | 0.49 | 0.99 | 6.96 | 1.89 | 13.17 | 13.65 | 2.17 | 0.51 | 0.00 | 16.05 | 7.95 |
| 19 | 4.50 | 1.60 | 1.55 | 5.90 | 5.65 | 12.65 | 6.00 | 7.90 | 0.00 | 0.00 | 1.51 | 0.99 | 1.01 | 7.09 | 1.92 | 13.41 | 13.90 | 2.73 | 0.00 | 0.00 | 15.82 | 8.10 |
| 20 | 5.40 | 1.60 | 1.55 | 5.90 | 5.65 | 12.65 | 6.00 | 6.40 | 0.40 | 0.00 | 1.80 | 0.98 | 1.00 | 7.07 | 1.91 | 13.37 | 13.86 | 2.72 | 0.00 | 0.00 | 15.77 | 8.07 |
| 21 | 4.95 | 1.20 | 1.25 | 5.45 | 5.65 | 12.65 | 6.00 | 7.15 | 0.20 | 0.00 | 1.65 | 0.74 | 0.81 | 6.50 | 1.91 | 13.31 | 13.79 | 2.45 | 0.26 | 0.00 | 15.95 | 7.30 |
| 22 | 5.75 | 1.20 | 1.40 | 3.90 | 6.30 | 12.40 | 5.90 | 7.75 | 0.00 | 0.00 | 1.95 | 0.75 | 0.92 | 4.74 | 2.17 | 13.30 | 13.82 | 2.71 | 0.00 | 0.00 | 15.99 | 5.66 |
| 23 | 5.75 | 1.20 | 1.40 | 2.00 | 6.30 | 12.40 | 5.90 | 7.75 | 0.00 | 0.00 | 1.96 | 0.75 | 0.92 | 2.44 | 2.17 | 13.33 | 13.86 | 2.71 | 0.00 | 0.00 | 16.03 | 3.36 |
| 24 | 5.10 | 1.60 | 1.55 | 4.50 | 5.65 | 12.65 | 6.00 | 6.40 | 0.40 | 0.00 | 1.70 | 0.98 | 1.00 | 5.36 | 1.90 | 13.30 | 13.78 | 2.19 | 0.52 | 0.00 | 16.20 | 6.36 |
| 25 | 5.10 | 1.60 | 1.55 | 4.50 | 5.65 | 12.65 | 6.00 | 6.40 | 0.40 | 0.00 | 1.69 | 0.99 | 0.99 | 5.32 | 1.89 | 13.21 | 13.68 | 2.18 | 0.51 | 0.00 | 16.09 | 6.32 |
| 26 | 4.00 | 0.00 | 0.00 | 9.00 | 8.00 | 0.00 | 5.00 | 0.00 | 2.00 | 1.00 | 1.27 | 0.00 | 0.00 | 10.27 | 2.58 | 0.00 | 11.00 | 0.00 | 2.48 | 0.64 | 16.06 | 10.91 |
| 27 | 4.00 | 1.50 | 0.00 | 9.00 | 8.00 | 0.00 | 5.00 | 0.00 | 2.00 | 1.00 | 1.28 | 0.89 | 0.00 | 10.33 | 2.60 | 0.00 | 11.07 | 0.00 | 2.49 | 0.64 | 16.16 | 10.98 |
| 28 | 4.00 | 3.00 | 0.00 | 9.00 | 8.00 | 0.00 | 5.00 | 0.00 | 2.00 | 1.00 | 1.29 | 1.78 | 0.00 | 10.40 | 2.62 | 0.00 | 11.14 | 0.00 | 2.51 | 0.65 | 16.26 | 11.05 |
| 29 | 6.25 | 0.00 | 0.00 | 4.50 | 5.75 | 12.50 | 6.75 | 7.00 | 0.00 | 0.00 | 2.06 | 0.00 | 0.00 | 5.32 | 1.92 | 13.03 | 15.37 | 2.38 | 0.00 | 0.00 | 17.29 | 5.32 |
| 30 | 6.25 | 1.50 | 0.00 | 4.50 | 5.75 | 12.50 | 6.75 | 7.00 | 0.00 | 0.00 | 2.08 | 0.92 | 0.00 | 5.35 | 1.93 | 13.12 | 15.47 | 2.39 | 0.00 | 0.00 | 17.41 | 5.35 |
| 31 | 6.25 | 3.00 | 0.00 | 4.50 | 5.75 | 12.50 | 6.75 | 7.00 | 0.00 | 0.00 | 2.09 | 1.85 | 0.00 | 5.39 | 1.95 | 13.21 | 15.58 | 2.41 | 0.00 | 0.00 | 17.53 | 5.39 |
| 32 | 5.10 | 1.00 | 0.45 | 4.00 | 4.69 | 13.00 | 5.84 | 7.00 | 0.70 | 0.00 | 1.49 | 0.61 | 0.45 | 4.75 | 1.58 | 13.62 | 13.37 | 2.76 | 0.90 | 0.00 | 15.84 | 5.20 |
| 33 | 5.50 | 2.00 | 0.00 | 4.00 | 6.00 | 10.00 | 5.50 | 8.00 | 0.00 | 0.00 | 1.86 | 1.25 | 0.00 | 4.85 | 2.06 | 10.69 | 12.84 | 2.81 | 0.00 | 0.00 | 14.90 | 4.85 |
| 34 | 7.00 | 0.00 | 2.00 | 4.00 | 5.50 | 7.50 | 5.00 | 8.00 | 0.00 | 0.00 | 2.41 | 0.00 | 1.34 | 4.93 | 1.92 | 8.15 | 11.87 | 2.83 | 0.00 | 0.00 | 13.79 | 6.26 |
| 35 | 6.00 | 3.00 | 3.00 | 4.00 | 4.50 | 4.00 | 5.50 | 8.38 | 0.00 | 0.50 | 2.07 | 1.90 | 2.01 | 4.93 | 1.57 | 4.35 | 13.08 | 2.97 | 0.00 | 0.35 | 14.65 | 7.28 |
| 36 | 6.00 | 3.00 | 0.00 | 5.00 | 6.00 | 7.50 | 5.50 | 8.00 | 1.00 | 0.00 | 2.05 | 1.88 | 0.00 | 6.10 | 2.07 | 8.08 | 12.95 | 2.81 | 1.33 | 0.00 | 16.34 | 6.10 |
| 37 | 4.00 | 0.00 | 1.00 | 5.00 | 6.70 | 6.00 | 5.25 | 10.40 | 0.00 | 0.00 | 1.37 | 0.00 | 0.66 | 6.13 | 2.32 | 6.49 | 12.41 | 3.66 | 0.00 | 0.00 | 14.73 | 6.79 |
| 38 | 4.00 | 0.00 | 1.00 | 5.00 | 6.70 | 6.00 | 5.25 | 10.40 | 0.00 | 0.00 | 1.37 | 0.00 | 0.66 | 6.13 | 2.32 | 6.49 | 12.41 | 3.66 | 0.00 | 0.00 | 14.73 | 6.79 |
| 39 | 4.00 | 0.00 | 1.00 | 5.00 | 6.70 | 6.00 | 5.25 | 10.40 | 0.00 | 0.00 | 1.37 | 0.00 | 0.66 | 6.13 | 2.32 | 6.49 | 12.41 | 3.66 | 0.00 | 0.00 | 14.73 | 6.79 |
| 40 | 4.00 | 0.00 | 1.00 | 5.00 | 6.70 | 6.00 | 5.25 | 10.40 | 0.00 | 0.00 | 1.37 | 0.00 | 0.66 | 6.13 | 2.32 | 6.49 | 12.41 | 3.66 | 0.00 | 0.00 | 14.73 | 6.79 | note: balance Nickel. All alloys except 26, 27 and 28 have 0.15 Hf, 0.05 C and 0.004 B.

The various alloying elements are added to nickel base superalloy compositions in specific amounts in order to achieve specific properties. The effect of these alloying elements is well-known.

Chromium is added principally because of its beneficial effects on hot corrosion resistance and oxidation resistance. It also is a strong solid solution strengthening element in the gamma phase. If the amount of chromium is too low, hot corrosion resistance falls to unacceptably low levels. The prior art, for example, U.S. Pat. No. 5,151,249, has also taught that at levels higher than about 5 w/o chromium high temperature microstructural instability results because the chromium contributes to an increased tendency to form TCP phases.

Cobalt is added to stabilize the alloy against the formation of TCP phases during extended high temperature operation. However, Co reduces the rupture strength and oxidation resistance of an alloy.

Tungsten, W, partitions to both the gamma and the gamma prime, and serves to strengthen each phase by solid solution strengthening. Tungsten, although undesirable for airfoils used in aircraft applications because its high density contributes to increasing the overall alloy density, is necessary because of its contribution to strengthening. Additionally, high levels of W appear to reduce the oxidation and corrosion resistance of the alloy and tends to promote formation of TCP phases.

Tantalum, Ta, is a gamma prime strengthener which also provides resistance to hot corrosion and resists the formation of equiaxed grains on the surface of castings known as freckles. Below minimum levels, strength of the alloy becomes low, while above about 10 w/o, the density of the alloy is undesirably increased.

Aluminum is the key alloying element in the formation of the gamma prime phase, and also contributes to oxidation resistance by contributing aluminum to surface aluminum oxides. If aluminum content is too low, then insufficient gamma prime phase is formed and both creep-rupture strength and oxidation resistance of the alloy become unacceptably low. However, increasing aluminum content contributes to an increasing tendency to from brittle TCP phases during extended exposure at elevated temperature. Furthermore, as Al is increased, the alloy can become difficult to solution heat treat, so there can be a problem with incipient melting during solution treatments.

Titanium is a strong gamma prime former. It readily substitutes for Al in the gamma prime phase.

Rhenium, Re, is a potent solid solution strengthening element in the gamma phase which is important in achieving high temperature strength, but is relatively dense. Re has been substituted for less potent solid solution strengthening elements such as Mo and Cr. Above about 3% (w/o) Re, there is an increased tendency to form TCP phases during extended high temperature exposures. Rhenium, in addition to being dense, is also expensive.

Yttrium, Y, in small amounts, improves oxidation resistance. However, Y at low levels appears to have no effect on the mechanical properties.

Figures 1, 2, 3:
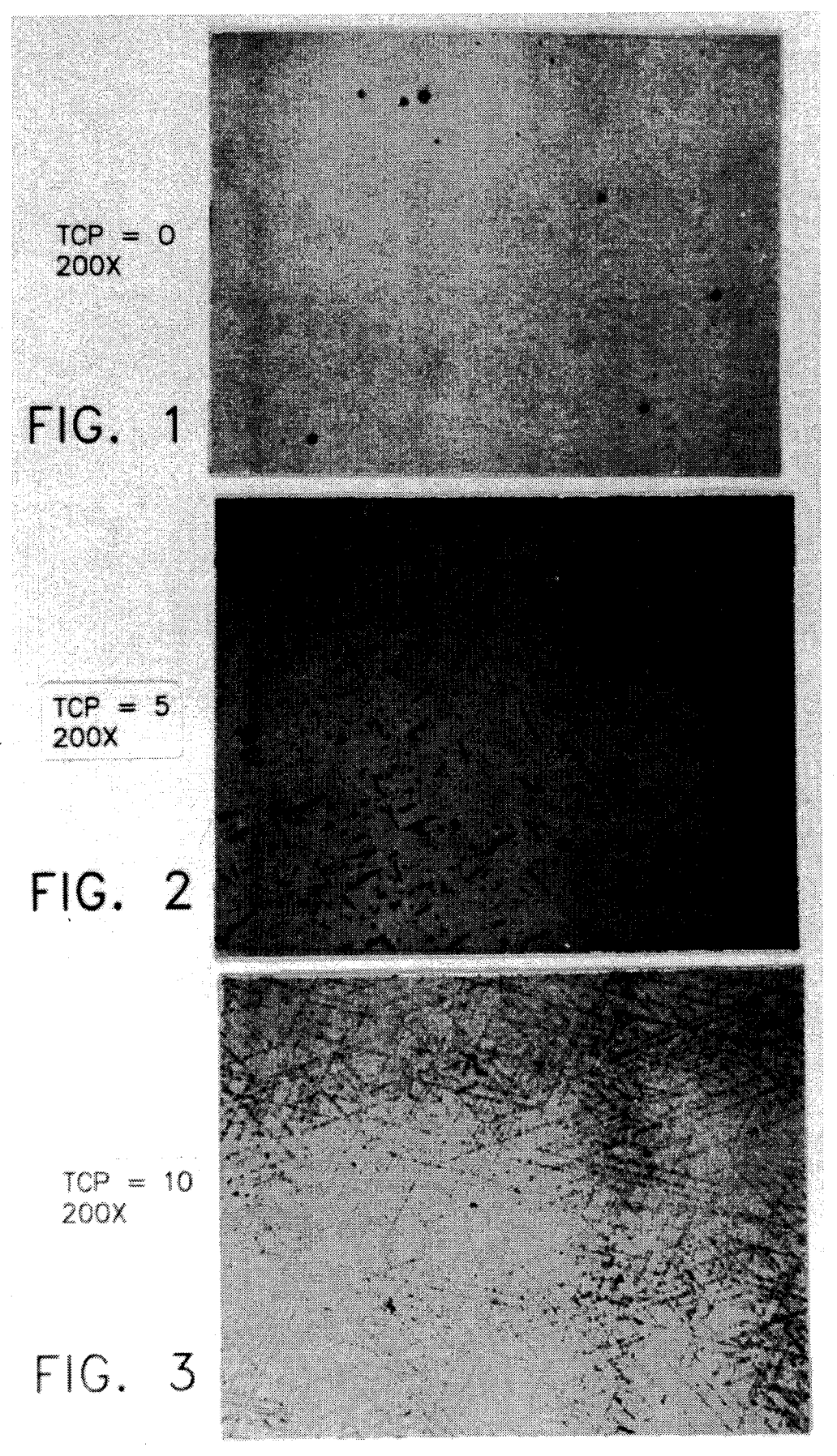

Testing of the alloys of Table I confirm the tendency of many of the elemental additions to form the undesirable TCP. Of the elements tested, Ru was found to be the only refractory element that did not contribute to undesirable topologically close-packed (TCP) phases after high temperature exposures. In fact, it is shown that the addition of Ru promotes stability. The manner of evaluation consisted of metallographically inspecting failed rupture bars tested at 2000° F. and 2100° F. After testing, longitudinal and transverse orientations were mounted and etched with Murakami's reagent (ASTM 98). The amount of TCP phase was compared with a set of photographic standards rated from 0–10. Zero means no TCP present while 10 refers to a photomicrograph saturated with TCP phase. FIGS. 1–3 contain some examples of post tested micrographs and their TCP ratings.

A set of 98 separate chemical compositions were thus evaluated including 43 containing Ruthenium. As previously noted, the science of chemistry and phase formation rests on the atomic basis with atomic formulas, so the statistical analysis of TCP formation was performed with the atomic per cent formulations. The well established literature of TCP formulation in nickel base superalloys also utilizes atomic formulations.

The analysis technique known as multiple linear regression was performed on the data set using the square root transformation of the TCP number ("$N_z$") as the independent variable. In order to more fully understand the quantitative effects of Ruthenium on TCP formation, four separate models developed from the data set. Table II provides the elemental coefficients (Coef.), their t-factor probabilities (Prob.) and the statistical data from the equations. All equations exhibit excellent statistical correlation with the factors.

Referring now to Table II, Model 1 includes all the data. Model 1 shows that Re, followed by Ta are strongest in promoting TCP formation in the range of investigation. Ru has a large negative coefficient while Co is slightly negative. In Model 2 the data set is limited to only the 43 alloys which contained Ru. Here Ru exhibits a small positive coefficient, but it remains considerably smaller than the other refractory solutes. Model 3 looks at the data using only the alloys which do not contain Ru. By contrasting the elemental coefficient changes between Models 2 and 3, it is apparent that Ru's presence dramatically causes the coefficients of Al, W, Cb and Ti to drop. Model 4 is just a simplification of Model 1 where elements with statistically similar coefficients are "added" together to form a new independent variable. This is viable since these similar elemental coefficients cannot be proven to be statistically different. FIG. 4 uses a simplification of the formula from Model 4 as its horizontal axis so that the effects of Ru on "$N_z$" can be readily seen; the Ru alloys exhibit less TCP phase at a given amount of added solute. All the more remarkable is the recognition that this inclusion of Ru, on an atom for atom basis, is at the expense of Ni.

TABLE II

| TCP MULTIPLE REGRESSION EQUATIONS | | | |
|---|---|---|---|
| MODEL | | | |
| #1 All Data | #2 Only Ru | #3 No Ru | #4 Proposed |

| VARIABLE | Coef. | Prob. | Coef. | Prob. | Coef. | Prob. | Coef. | Prob. |
|---|---|---|---|---|---|---|---|---|
| Al | 0.564 | <.0001 | 0.338 | .0109 | 0.727 | <.0001 | | |
| Ta | 1.116 | <.0001 | 0.892 | .0109 | 1.098 | .0027 | 1.024 | <.0001 |
| Cr | 0.705 | <.0001 | 0.982 | <.0001 | 0.814 | <.0001 | | |
| W | 0.420 | .0084 | 0.424 | .0834 | 0.710 | .0036 | | |
| Mo | 0.741 | <.0001 | 0.807 | <.0001 | 1.181 | <.0001 | | |
| Re | 1.436 | <.0001 | 1.594 | .0007 | 1.496 | <.0001 | 1.417 | <.0001 |
| Cb | 0.710 | .083 | 0.284 | .7693 | 0.729 | .096 | | |
| Co | −0.089 | <.0001 | −0.079 | .0529 | −0.061 | .0115 | −0.091 | <.0001 |
| Ti | 0.548 | .0005 | 0.184 | .3672 | 0.959 | .0003 | | |
| Ru | −0.407 | <.0001 | 0.241 | .1483 | | | −0.399 | <.0001 |
| Al + Ti + W | | | | | | | 0.510 | <.0001 |
| Cr + Mo + Cb | | | | | | | 0.711 | <.0001 |
| Intercept | −15.595 | | −14.7511 | | −19.51035 | | −14.7400 | |
| Correl. Coef. | .90 | | .95 | | .86 | | .90 | |
| RMS Resid. | .419 | | .359 | | .371 | | .412 | |
| Count | 98 | | 43 | | 55 | | 98 | |

*notes:
1) Sq. Rt. Transformation of Dependent Variable.
2) Correl. Coef. is the Correlation Coefficient for the model.
3) Prob. is the probability based upon the t-test that the coefficient can actually be zero.
4) Thus model #1 would yield the mathematical relationship:
"Nz" = (TCP #)$^{1/2}$ = 0.564 Al + 1.116 Ta + 0.705 Cr + 0.420 W + 0.741 Mo + 1.436 Re + 0.710 Cb − 0.089 Co + 0.548 Ti − 0.407 Ru − 15.595

Figure 5:
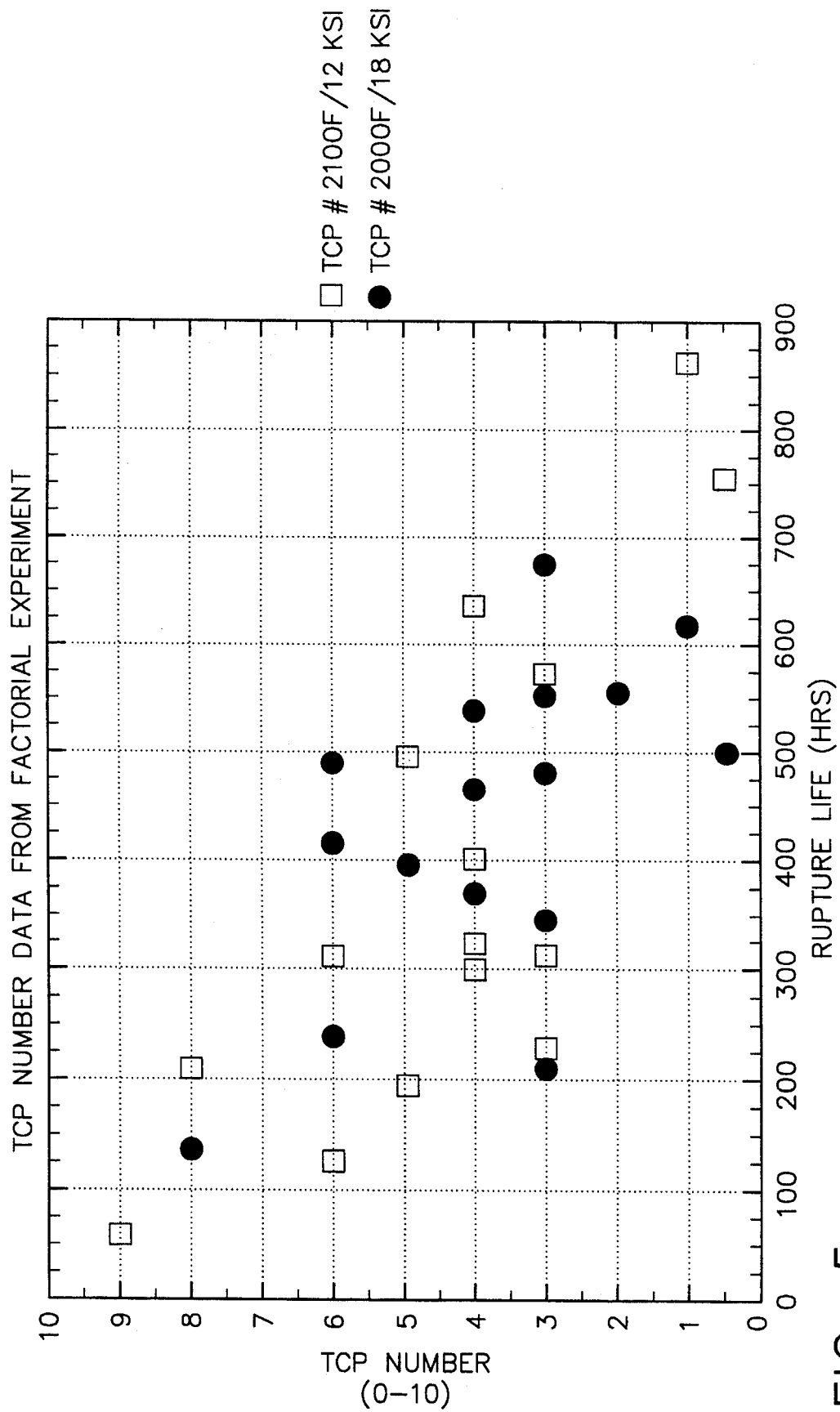
FIG. 5 is a graph of elevated strength rupture life versus TCP number for several alloys.

To further explore the effects of Ru, a fractional factorial experiment was performed with 17 alloys varying the elements Re, Mo, Cr, Ru and the sum of Ta plus Ti at two levels. Al, Co, W and the minor adds of C, B and Hf were held constant. Furthermore the sum of Ta plus Ti was held constant in the total amount of atomic per cent so that the totality of gamma prime formers was constant. These 17 alloys are numbered 5 through 21 in Table I. The importance of the precipitation of TCP phases is underscored by FIG. 5, on which the rupture life at 2000° F./18 ksi and 2100° F./12 ksi is plotted versus the TCP number, for this controlled experiment. Clearly long life and TCP phase precipitation are mutually exclusive. As FIG. 5 indicates, TCP Numbers of 3 or less are required for the best rupture life.

The designed experiment allows comparisons between Ru and each elemental factor. This experiment clearly indicates that the inclusion of Ru maintains or improves strength while reducing the tendency for TCP phase formation. Several examples are given which are referenced to Table I for the corresponding atomic per cent formulations.

| | Element Composition (w/o) | | | | | | Rupture Life (hrs.) | |
|---|---|---|---|---|---|---|---|---|
| Alloy | Re | Ru | Mo | Cr | Ta | Ti | 2000 F | 2100 F |
| 10 | 5.40 | 0.80 | 1.55 | 5.00 | 6.40 | 0.40 | 543.6 | 402.2 |
| 11 | 4.50 | 1.60 | 1.55 | 5.00 | 6.40 | 0.40 | 618.2 | 858.2 |

Figure 6:
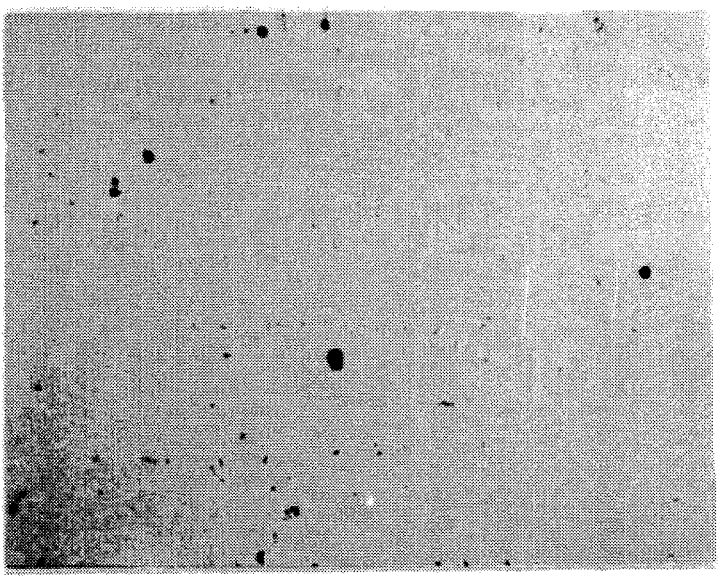
FIGS. 6–7 are photomicrographs of Alloy 11 after stress rupture testing at 2000° F./18 ksi and 2100° F./12 ksi respectively.
Figure 7:
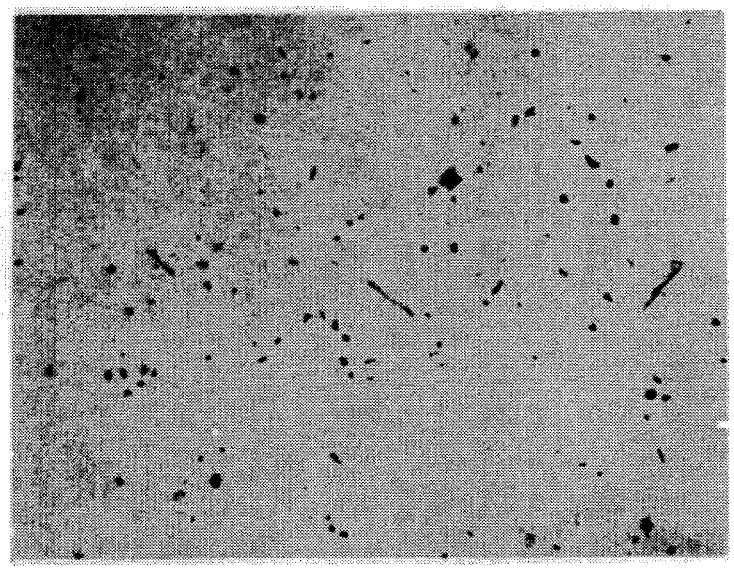
Figure 8:
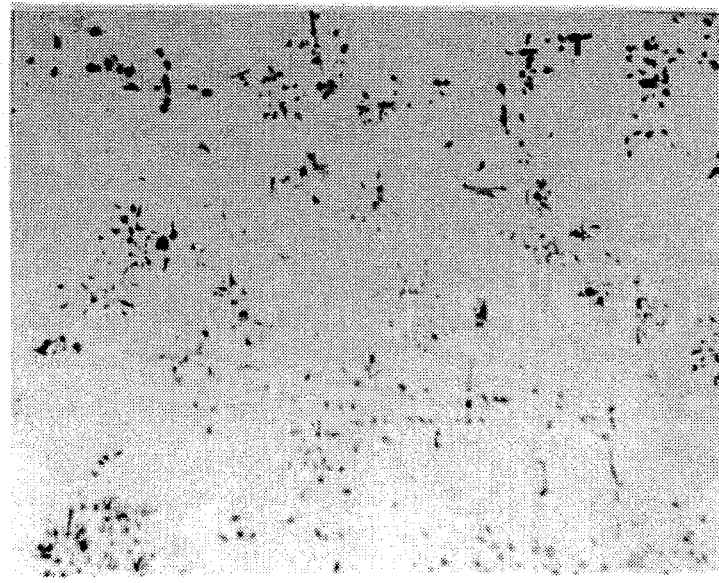
FIGS. 8–9 are photomicrographs of Alloy 10 after stress rupture testing at 2000° F./18 ksi and 2100° F./12 ksi respectively.
Figure 9:
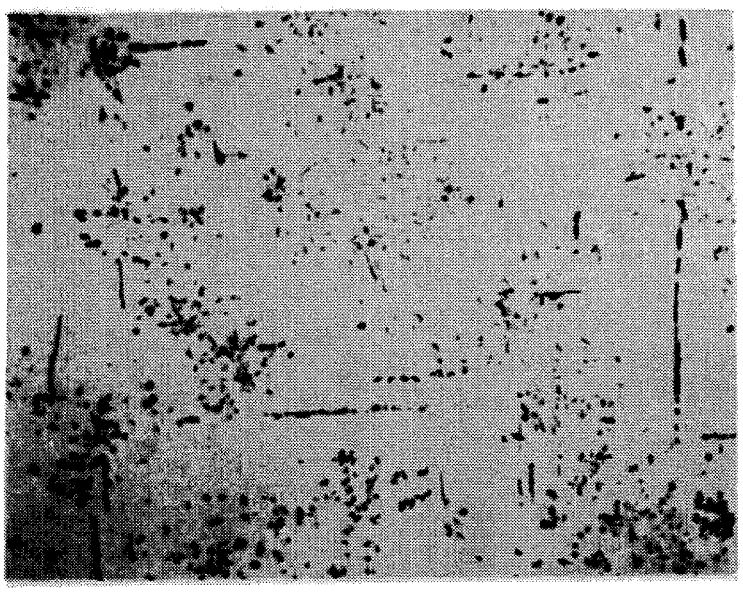

FIG. 6–9 show microstructures taken from the gage section of failed bars. FIGS. 6 and 7 are the microstructures of Alloy 11 at 2000° F./18 ksi and 2100° F./12 ksi respectively. FIGS. 8–9 are the microstructures of Alloy 10 at 2000° F./18 ksi and 2100° F./12 ksi respectively. Alloy 11 displays less TCP incidence than alloy 10. These alloys each contain 0.05% w/o C so that a constant carbide fraction resides in each photomicrograph. The Ru content was increased at the expense of Re, while the amounts of the other elements were held substantially constant.

| | Element Composition (w/o) | | | | | | Rupture Life (hrs.) | |
|---|---|---|---|---|---|---|---|---|
| Alloy | Re | Ru | Mo | Cr | Ta | Ti | 2000 F | 2100 F |
| 7 | 4.50 | 1.60 | 0.95 | 5.00 | 7.90 | 0.0 | 503.9 | 755.5 |
| 9 | 4.50 | 0.80 | 1.55 | 5.00 | 7.90 | 0.0 | 556.2 | 497.9 |

Figure 10:
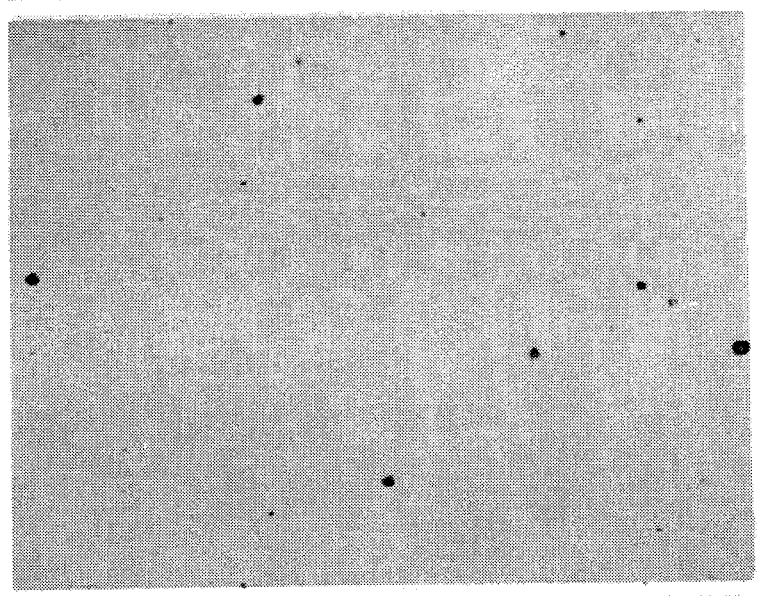
FIGS. 10 and 11 are photomicrographs of Alloy 7 after stress rupture testing at 2000° F./18 ksi and 2100° F./12 ksi respectively.
Figure 11:
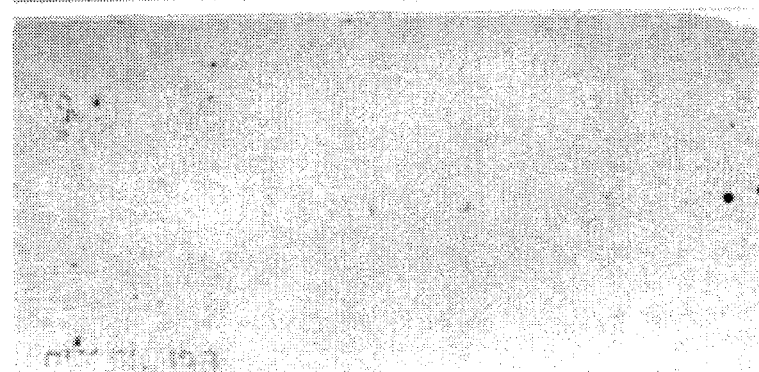

FIGS. 10–13 show microstructures taken from the gage section of failed bars. FIGS. 10 and 11 are the microstructures of Alloy 7 at 2000° F./18 ksi after 503.9 hours and 2100° F./12 ksi after 755.5 hours respectively. FIGS. 12 and 13 are the microstructures of Alloy 9 at 2000° F./18 ksi after 556.2 hours and 2100° F./12 ksi after 497.9 hours respectively. Alloy 7 displays less TCP incidence than alloy 9. These alloys each contain 0.05% w/o C so that a constant carbide fraction resides in each photomicrograph. The Ru content was increased at the expense of Mo, while the amounts of the other elements were held substantially constant.

| | Element Composition (w/o) | | | | | | Rupture Life (hrs.) | |
|---|---|---|---|---|---|---|---|---|
| Alloy | Re | Ru | Mo | Cr | Ta | Ti | 2000 F | 2100 F |
| 7 | 4.50 | 1.60 | 0.95 | 5.00 | 7.90 | 0.0 | 503.9 | 755.5 |
| 13 | 4.50 | 0.80 | 0.95 | 5.90 | 7.90 | 0.0 | 374.1 | 299.7 |

Figure 15:
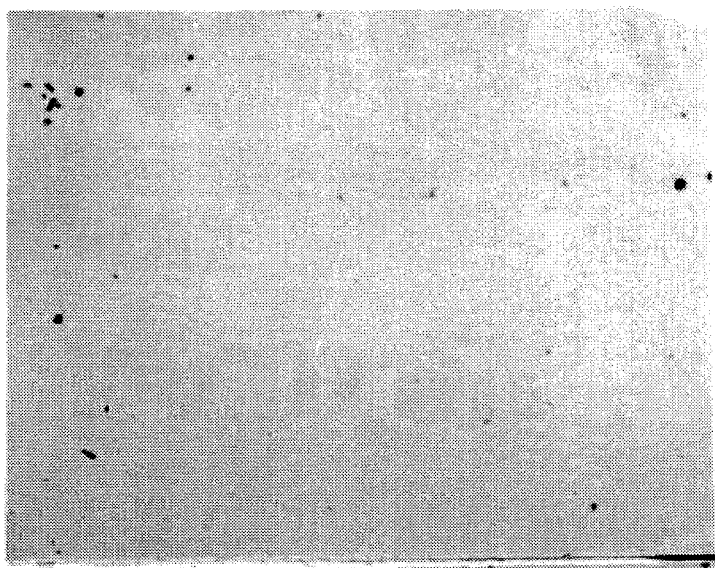
Figure 16:
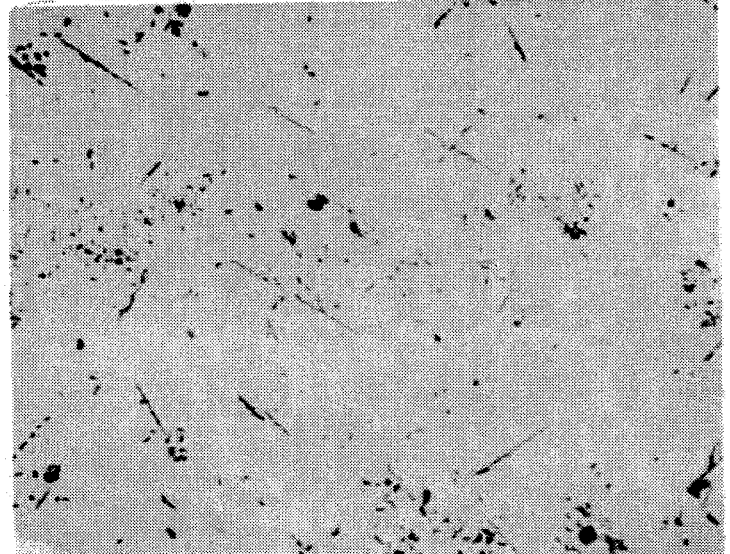
FIGS. 16 and 17 are photomicrographs of Alloy 13 after stress rupture testing at 2000° F./18 ksi and 2100° F./12 ksi respectively.
Figure 17:
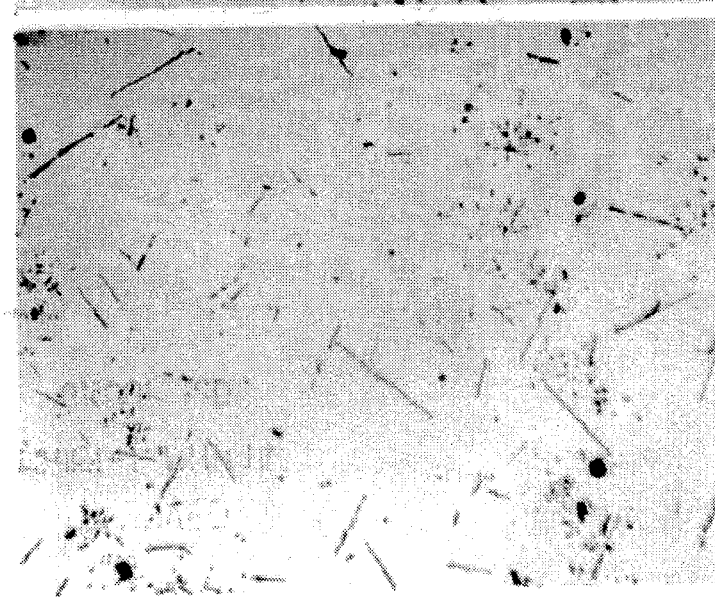

FIGS. 14–17 show microstructures taken from the gage section of failed bars. FIGS. 14 and 15 are the microstructures of Alloy 7 at 2000° F./18 ksi after 503.9 hours and 2100° F./12 ksi after 755.5 hours respectively. These photomicrographs are identical to FIGS. 10 and 11, discussed above. FIGS. 16 and 17 are the microstructures of Alloy 13 at 2000° F./18 ksi after 374.1 hours and 2100° F./12 ksi after 299.7 hours respectively. Alloy 13 displays more TCP formation than alloy 7. These alloys each contain 0.05% w/o C so that a constant carbide fraction resides in each photomicrograph. The Ru content was increased at the expense of Cr, while the amounts of the other elements were held substantially constant.

|       | Element Composition (w/o) |      |      |      |      |     | Rupture Life (hrs.) |        |
|-------|------|------|------|------|------|-----|--------|--------|
| Alloy | Re   | Ru   | Mo   | Cr   | Ta   | Ti  | 2000 F | 2100 F |
| 11    | 4.50 | 1.60 | 0.95 | 5.00 | 7.90 | 0.0 | 618.2  | 858.2  |
| 9     | 4.50 | 0.80 | 1.55 | 5.00 | 7.90 | 0.0 | 556.2  | 497.9  |

Figure 18:
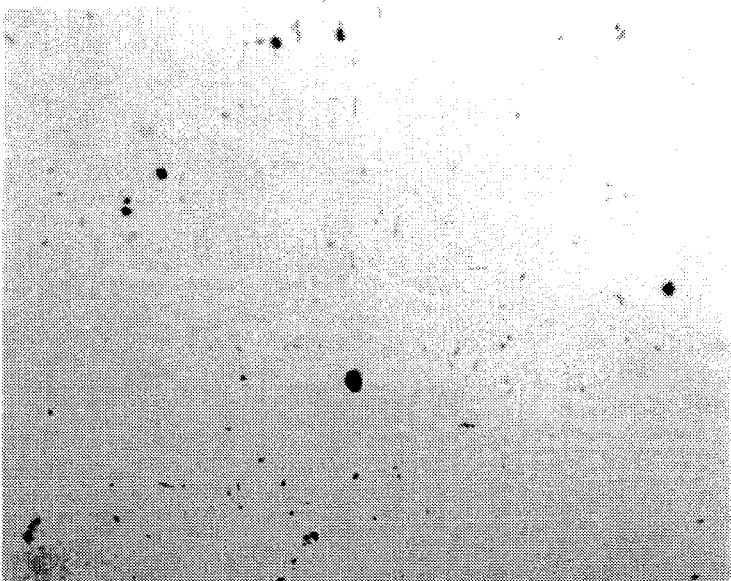
FIGS. 18 and 19 are photomicrographs of Alloy 11 after stress rupture testing at 2000° F./18 ksi and 2100° F./12 ksi respectively.
Figure 19:
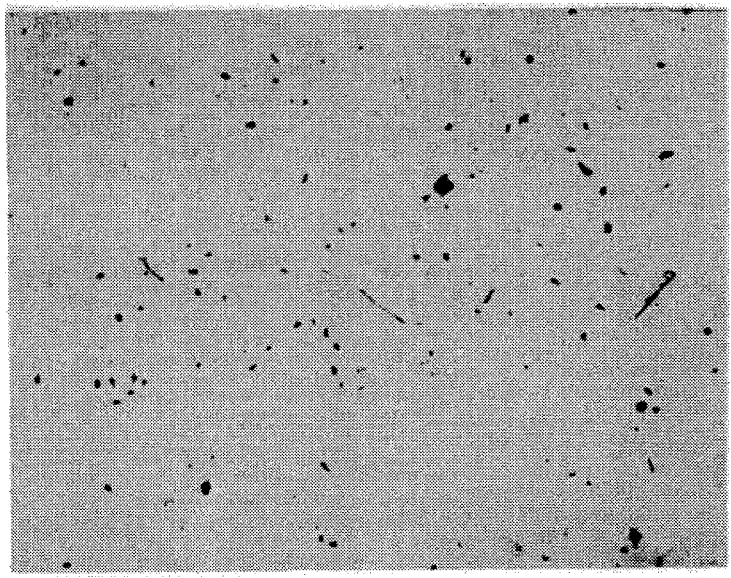
Figure 20:
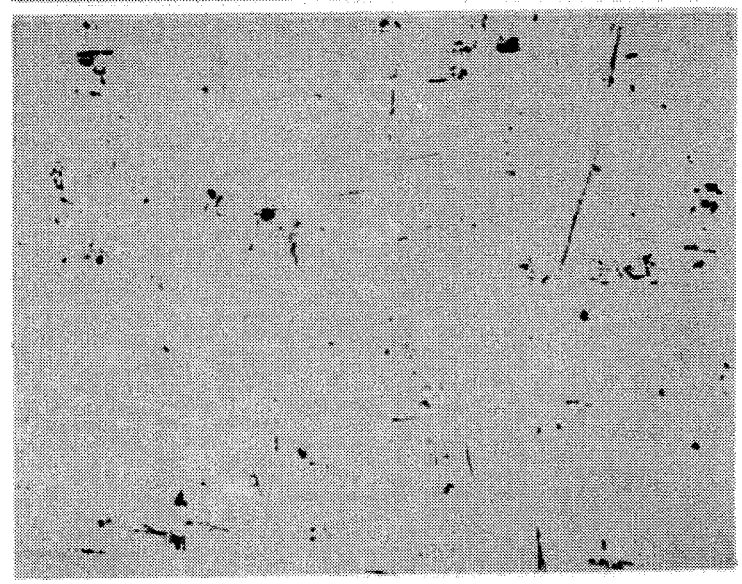
FIGS. 20 and 21 are photomicrographs of Alloy 9 after stress rupture testing at 2000° F./18 ksi and 2100° F./12 ksi respectively.
Figure 21:
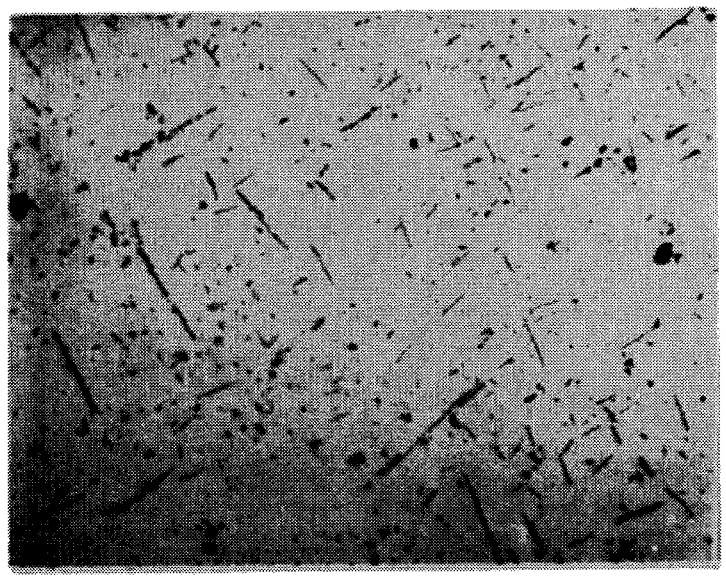

FIGS. 18–21 show microstructures taken from the gage section of failed bars. FIGS. 18 and 19 are the microstructures of Alloy 11 at 2000° F./18 ksi after 618.2 hours and 2100° F./12 ksi after 858.2 hours respectively. FIGS. 20 and 21 are the microstructures of Alloy 9 at 2000° F./18 ksi after 556.2 hours and 2100° F./12 ksi after 497.9 hours respectively. These photomicrographs are identical to FIGS. 6 and 7. Alloy 11 displays less TCP formation than alloy 9. These alloys each contain 0.05% w/o C so that a constant carbide fraction resides in each photomicrograph. The Ru content was increased at the expense of Mo, while the amounts of the other elements were held substantially constant.

To fully comprehend the effects of ruthenium additions on the alloys of the present invention, it is necessary to understand the mechanisms of partitioning of each of the critical elements as well as their interactions with other critical elements as their atomic percent is varied in nickel base superalloys.

Prior art teachings indicate that Re additions partition largely to the gamma phase, acting as a solid solution strengthener, while simultaneously causing slight decreases in the partitioning of Al, Cr and W to the gamma prime. The overall gamma prime amount remains constant, however, over the ranges normally added.

Prior art teachings also indicate that Mo additions partition to the gamma prime in about a ⅓ partitioning ratio, on an atom by atom basis, (Mo in gamma prime divided by Mo in gamma). Mo increases the amount of the gamma prime phase by making Al less soluble in the gamma phase. Mo specifically substitutes for Cr in the gamma prime phase but does not substitute for the Al or the Ti in the gamma prime phase.

The prior art teaches that W additions partition to the gamma and the gamma prime phase with a partitioning ratio of about 0.5 to 2.5 in the gamma prime, depending on the alloy. As the amount of W increases, it does not affect the ratios of Al or Ti which partition to gamma prime, but causes a slight decrease in the Cr and Mo ratios in the gamma prime. It also slightly increases the gamma prime amount.

Ta partitions almost completely to the gamma prime phase, increasing the gamma prime fraction. As Ta is added, the concentrations of Al, Ti, W and Cr in both the gamma and the gamma prime phases is unaffected. The concentrations of these elements remain constant in each of these phases. However, Mo slightly drops in the gamma prime phase.

To further explore the influence of Ru on nickel base superalloy phase chemistry, two model alloys were chosen, based on the literature and experience, which are metallurgically unstable; both readily form TCP after exposure at 2000° F. To each alloy, 1.5 and 3.0 w/o Ru was added at the expense of Ni. The first alloy designated 1444+4Re is given in Table I as alloy 26. The two modified compositions with 1.5 and 3.0 w/o Ru are designated as alloys 27 and 28 respectively. The second base alloy, covered in U.S. Pat. No. 5,151,249 and known as R'162+0.5Al (alloy 29, Table I) was also melted along with two others based on the composition but with 1.5 and 3.0 a/o Ru added. These latter are alloys 30 and 31. After the standard solution and age heat treatment, the R'162+0.5Al chemistries displayed TCP phase, although the amount decreased with increasing Ru. The three alloys based upon 1444+4Re did not show TCP after a standard solution and age heat treatment typically given to such alloys.

The gamma and gamma prime compositions of the six alloys discussed above were analyzed after chemical phase extraction by established and well known techniques. These results are tabulated in Table III. As Ru is added, the gamma prime amount in each alloy also remains relatively constant as given below:

| Alloy | Weight Fraction (%) (Gamma Prime) | Alloy | Weight Fraction (%) (Gamma Prime) |
|---|---|---|---|
| 1444 + 4 Re + 0 Ru   | 57.3 | R'162 + .5 Al + 0 Ru   | 70.0 |
| 1444 + 4 Re + 1.5 Ru | 55.9 | R"162 + .5 Al + 1.5 Ru | 69.5 |
| 1444 + 4 Re + 3.0 Ru | 59.2 | R'162 + .5 Al + 3.0 Ru | 69.8 |

TABLE III

CHEMICAL ANALYSIS of PHASE EXTRACTIONS (wt. %)

| Alloy | Phase | Ni | Al | Cb | Ti | Cr | W | Re | Ru | Co | Ta |
|---|---|---|---|---|---|---|---|---|---|---|---|
| 1444 + 4 Re + 0 Ru   | γ  | 62.04 | 1.53 | 0.24 | 0.30 | 17.30 | 8.53 | 9.80  | 0.00 | 0.00  | 0.00 |
|                      | γ' | 77.65 | 7.51 | 1.62 | 3.24 | 1.84  | 7.57 | 0.24  | 0.00 | 0.00  | 0.00 |
| 1444 + 4 Re + 1.5 Ru | γ  | 60.86 | 2.02 | 0.26 | 0.40 | 16.79 | 7.72 | 9.48  | 2.46 | 0.00  | 0.00 |
|                      | γ' | 76.28 | 7.40 | 1.54 | 3.33 | 2.82  | 8.30 | 0.22  | 0.74 | 0.00  | 0.00 |
| 1444 + 4 Re + 3.0 Ru | γ  | 61.28 | 2.74 | 0.24 | 0.48 | 15.67 | 6.35 | 9.27  | 3.90 | 0.00  | .0.00 |
|                      | γ' | 72.63 | 6.51 | 1.54 | 3.01 | 4.44  | 9.14 | 0.37  | 2.30 | 0.00  | 0.00 |
| R162 + .5 Al + 0 Ru  | γ  | 37.94 | 2.83 | 0.00 | 0.00 | 11.16 | 6.59 | 20.64 | 0.00 | 19.81 | 0.74 |
|                      | γ' | 65.70 | 8.42 | 0.00 | 0.00 | 1.62  | 5.35 | 0.46  | 0.00 | 9.31  | 9.80 |
| R162 + .5 Al + 1.5 Ru| γ  | 42.29 | 3.81 | 0.00 | 0.00 | 8.57  | 4.23 | 18.54 | 1.56 | 20.16 | 0.83 |
|                      | γ' | 61.60 | 7.99 | 0.00 | 0.00 | 2.76  | 6.35 | 0.95  | 1.50 | 9.10  | 9.72 |

TABLE III-continued

CHEMICAL ANALYSIS of PHASE EXTRACTIONS (wt. %)

| Alloy | Phase | Ni | Al | Cb | Ti | Cr | W | Re | Ru | Co | Ta |
|---|---|---|---|---|---|---|---|---|---|---|---|
| R162 + .5 Al + | γ | 44.65 | 4.62 | 0.00 | 0.00 | 7.29 | 2.59 | 18.80 | 1.49 | 19.98 | 0.59 |
| 3.0 Ru | γ | 58.44 | 7.70 | 0.00 | 0.00 | 3.22 | 7.10 | 0.81 | 3.62 | 9.21 | 9.85 |

However, a number of unexpected and surprising events occur as Ru is added to the Ni-base superalloys of the present invention. Normally, it has been observed in Ni-base superalloys that Al and Ti partition to the gamma prime phase. The tendency to partition in this manner is very strong. Also, Cb partitions to the gamma prime phase. However, the addition of Ru to the alloy in the amounts of the present invention causes the partition of Al and Ti to the gamma phase, while Re, W and Cr increase in concentration in the gamma prime phase. Also, as Ru is added, Ru increases in concentration in the gamma prime phase, while the gamma prime volume fraction remains relatively constant. Without wishing to be held to a theory, the addition of Ru (at the expense of Ni) to the alloy chemistry remarkably modifies the phase chemistry. In the R'162+0.5Al alloy system, Ru causes Ni to leave the gamma prime phase while Cr and Ru substitute for Ni on an atom for atom basis in the standard nickel face-centered sites. Simultaneously, Al leaves the gamma prime phase and is replaced by W, Re and Ta atom by atom at Al corner sites. The net result is removal of the principal elemental ingredients of TCP phases from the gamma matrix, where such phases are formed. In the 1444+4Re alloy, a similar result is noted; only the presence of Ti in this alloy causes Cr to occupy Al sites in the gamma prime phase. Thus, in alloy 1444+4Re as Ru is added to the alloy, it replaces Ni while causing Al, Ti and Cb to enter the gamma phase. These elements are now replaced atom for atom by W, Re and Cr which occupy the Al sites. The effect of Ti on Cr site occupancy preference is supported by the literature. The net result is the depletion of W, Re and Cr from the gamma matrix which inhibits TCP phase formation. The TCP chemistry is nominally 50–75% made up of these refractory elements with the balance Ni and Co. It is generally accepted that these phases form in the gamma matrix. Thus the addition of Ru, by affecting the partitioning of elements responsible for TCP formation, improves the microstructural stability of the alloys of the present invention by limiting the detrimental formation of TCP, which results in improved stress rupture life at elevated temperatures. Although TCP cannot be totally eliminated, the addition of Ru can keep the TCP number at 3 or less, see FIGS. 1–3 and 5. Empirically, an alloy having a TCP of 3 or less will contain some TCP, but not enough to cause a significant deterioration in the stress rupture properties of the alloy. The alloys of the present invention have acceptable stress rupture lives at elevated temperatures and have TCP numbers at 3 or less.

Figure 22:
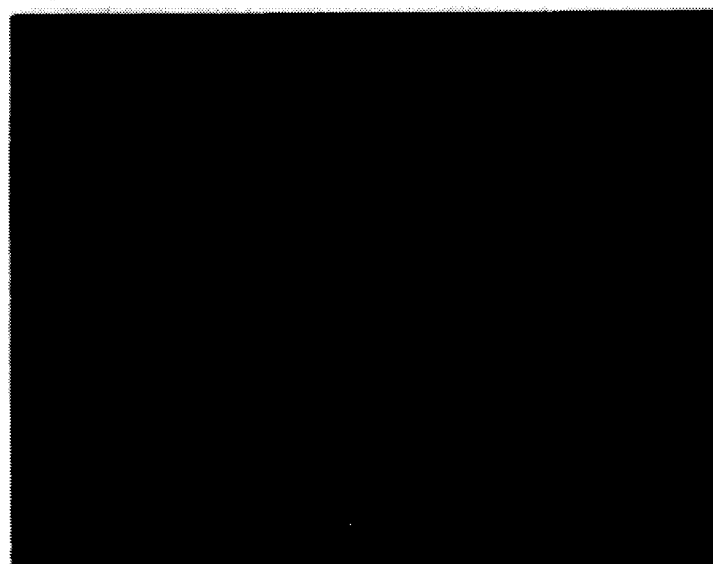
FIGS. 22, 23 and 24 are a series of photomicrographs showing the microstructures of alloys 26, 27 and 28 respectively (1444/4 w/o Re+0 w/o Ru, 1444/4 w/o Re+1.5 w/o Ru and 1444/4 w/o Re+3.0 w/o Ru respectively) after stress rupture testing.
Figure 23:
Figure 24:
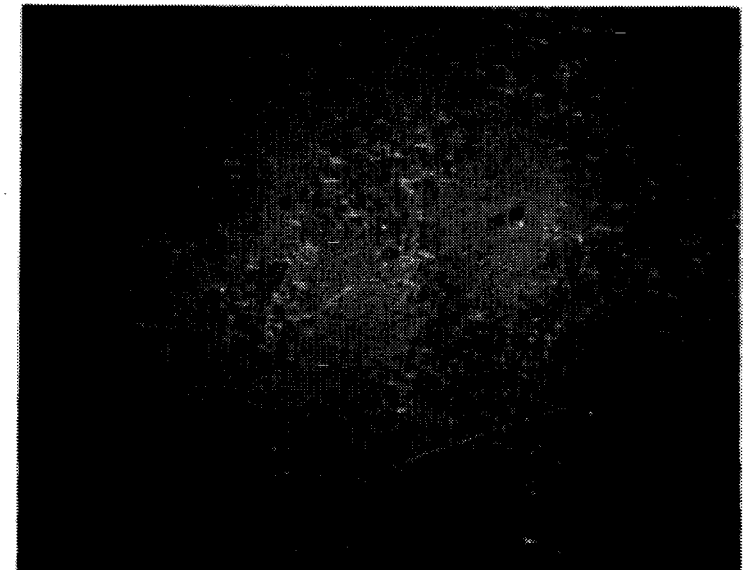
Figure 25:
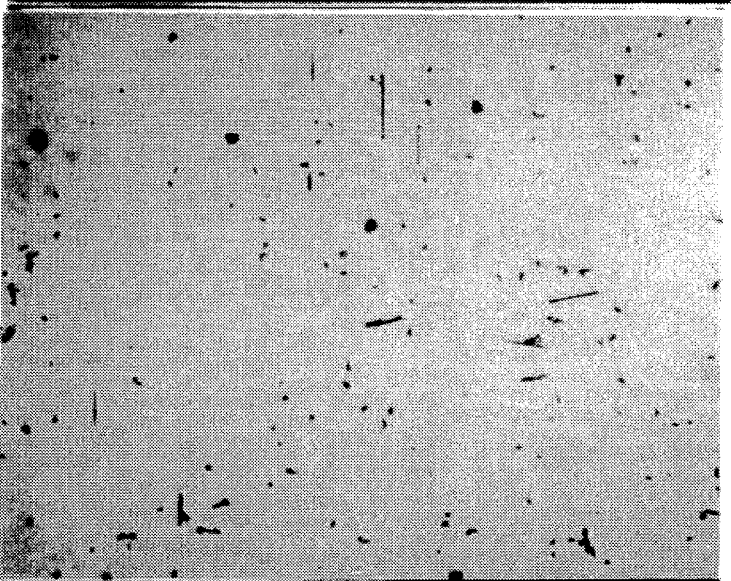
FIGS. 25, 26 and 27 are a series of photomicrographs showing the microstructures of alloys 29, 30 and 31 respectively (R'162/+0.5 w/o Al+0 a/o Ru, R'162/+0.5 w/o Al+1.5 w/o Ru and R'162/+0.5 w/o Al+3.0 w/o Ru respectively) after stress rupture testing.
Figure 26:
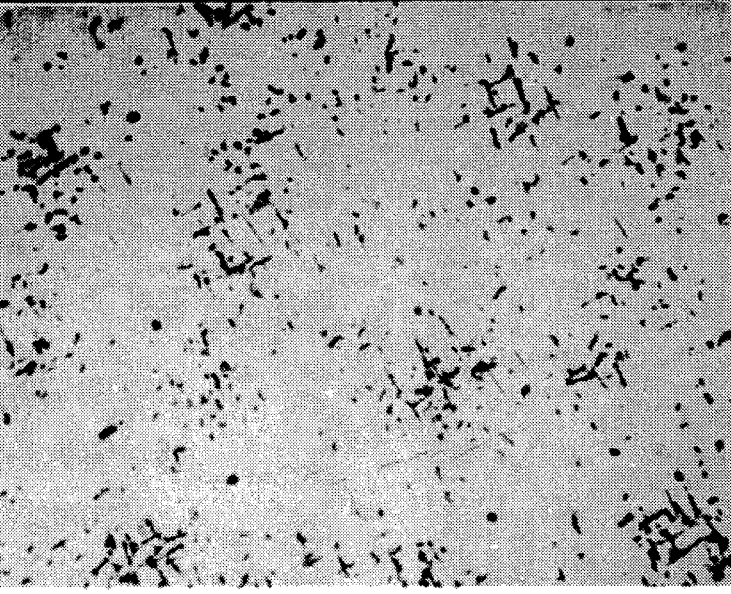
Figure 27:
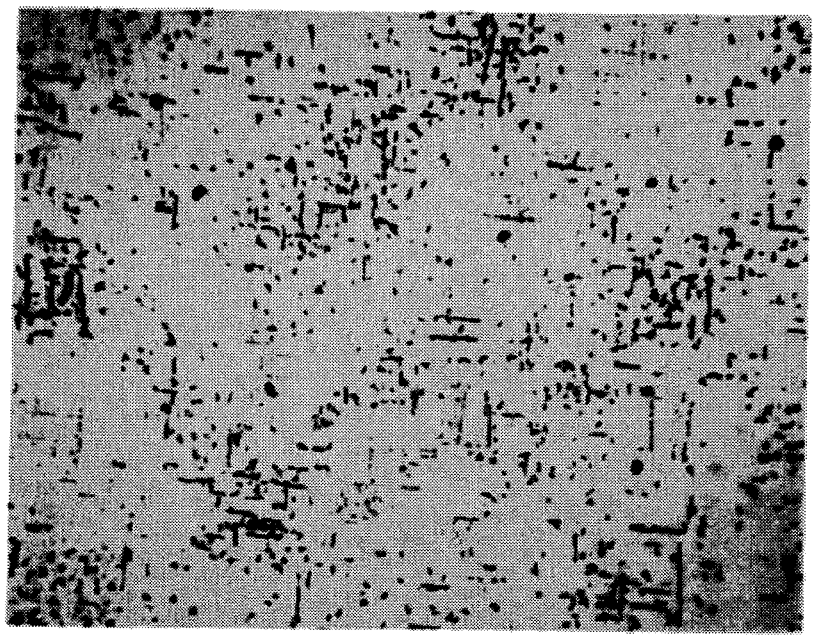

The two alloys analyzed by chemical extraction were subsequently tested in stress rupture at 2000° F. with the results given in Table IV. Interestingly the Ru additions only slightly strengthened the Alloy 1444 series while weakening the Alloy R'162 series. All microstructures of failed bars revealed the presence of TCP phases. The amount of TCP decreased with increasing amounts of Ru added to the 1444 base alloy, as noted in FIGS. 22–24. FIGS. 22, 23 and 24 are photomicrographs of Alloy 1444+4Re at three Ru levels, +0 Ru, +1.5 Ru and +3.0 Ru respectively after stress rupture testing at 2000° F. and 16 ksi. Interestingly, an increase of TCP was noted in the R'162 system with increasing Ru, FIGS. 25–27. FIGS. 25, 26 and 27 are photomicrographs of Alloy R'162+0.5Al at three Ru levels, +0 Ru, +1.5 Ru and +3.0 Ru respectively after stress rupture testing at 2000° F. and 18 ksi. This is contrary to the electron vacancy numbers (Nv) calculated for each alloy. Note from Table IV that these alloys are not within the compositional limits of the present invention, with the 1444 series being high in (Cr+Mo+Cb) and the R'162 series being high in (Al+Ti+W). Thus the beneficial effects of Ru on superalloys appears to be bounded by the compositions of the present invention.

TABLE IV

STRESS RUPTURE DATA FROM PHASE EXTRACTION ALLOYS

| Alloy | Ru (at %) | Life (hrs)* | $N_v$** | Cr + Mo + Cb (at. %) | Al + Ti + W (at. %) |
|---|---|---|---|---|---|
| 1444 + 4 Re + 0 Ru | 0 | 86.0, 114.0 | 2.06 | 10.9 | 16.1 |
| 1444 + 4 Re + 1.5 Ru | 1.5 | 163.1, 162.3 | 2.13 | 11.0 | 16.2 |
| 1444 + 4 Re + 3.0 Ru | 3.0 | 286.8, 297.0 | 2.18 | 11.1 | 16.3 |
| R162 + 0.5 Al + 0 Ru | 0 | 397.3, 490.9 | 2.40 | 5.3 | 17.3 |
| R162 + 0.5 Al + 1.5 Ru | 1.5 | 375.0, 422.5 | 2.34 | 5.4 | 17.4 |
| R162 + 0.5 Al + 3.0 Ru | 3.0 | 317.2, 323.9 | 2.35 | 5.5 | 17.5 |

*1444 series alloys tested at 2000 F/16 ksi, R162 series tested at 2000 F/18 ksi
**Electron vacancy number ($N_v$) calculated from matrix chemistries using standard elemental electron hole numbers Further evaluation of the Ru-containing alloys of the present invention included consideration of the extent, if any, to which the element Ru would affect or promote the occurrence of SRZ adjacent a Pt-Al coating (identified as RT22G coating) used for environmental protection during high temperature exposures. As has been reported, Al or Al alloy coatings are frequently used for such protection in the high temperature operating sections of gas turbine engines. Unfortunately, the element Al in such coatings can contribute to the formation of SRZ beneath the coating after exposure at temperatures of at least about 1800° F., even without applied load.

During evaluation of the present invention, a large number of comparisons were made between alloy composition and SRZ formation. Such comparisons were made after coating specimens with a Pt-Al coating and exposing at 2000° F. for 400 hrs. without load by methods known to those skilled in the art. Statistical analysis of the results of these evaluations produced the following relationship for use in a method for predicting the amount of SRZ which will form in an alloy. This relationship, in which the listed elements are in atomic percent, was produced by multiple regression techniques:

$$[SRZ]^{1/2} = -7.59 + 14.41\ (\%\ Re) + 1.88\ (\%\ W) + 1.65\ (\%\ Ru) - 3.52\ (\%\ Cr) - 2.33\ (\%\ Mo)$$

Re has a high positive coefficient with respect to SRZ formation. It was found that the contribution of Ru to SRZ formation, although positive, was an order of magnitude less than that of Re, indicating that Re is a stronger promoter of SRZ formation than Ru. Accordingly, it was recognized that the stability of an alloy of the type to which the present invention relates can be enhanced by adding Ru along with Re, and in some instances as a substitute on an atom by atom basis for Re.

Figure 28:
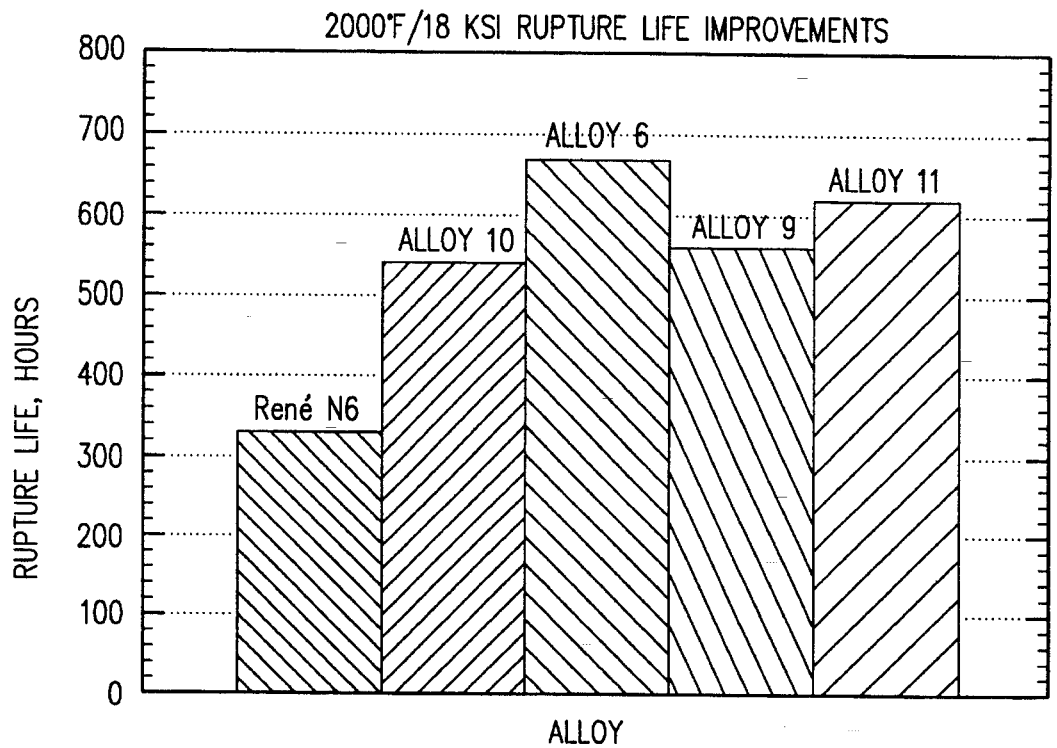
FIG. 28 is a bar graph comparison of 2000° F. stress rupture life of various alloys.
Figure 29:
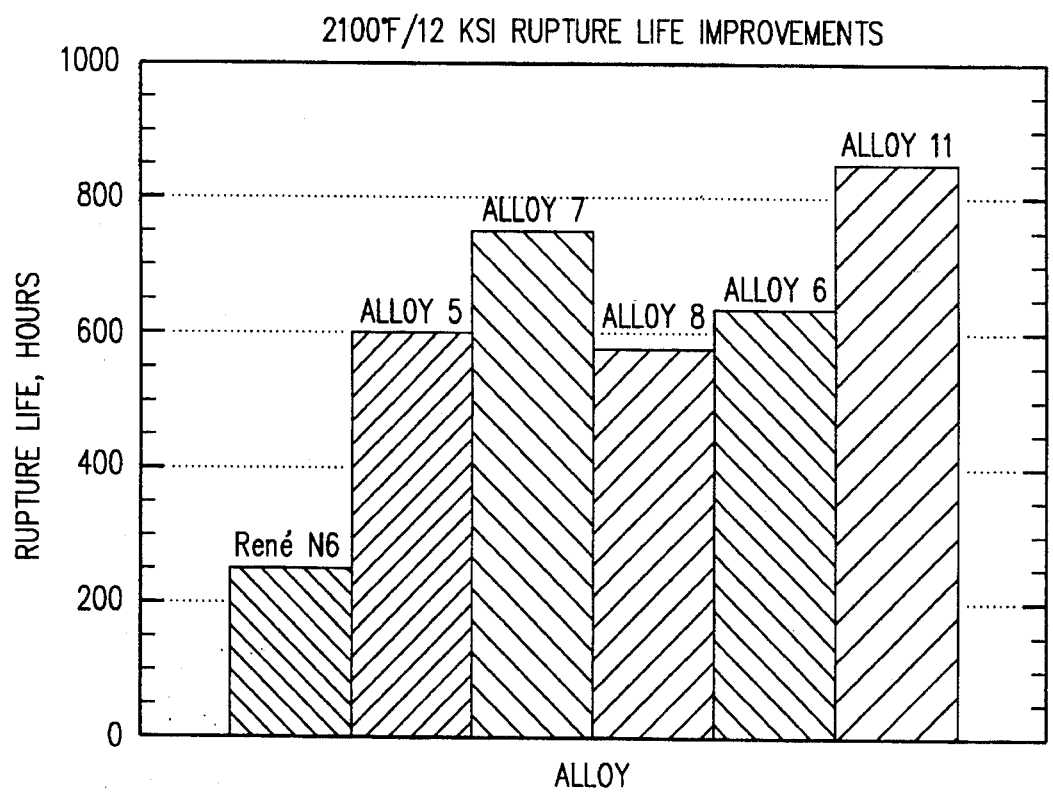
FIG. 29 is a bar graph comparison of 2100° F. stress rupture life of various alloys.

Stress rupture tests were conducted on the vast majority of alloys in Table 1 at 2000° F. and 2100° F. Data from several of the alloys is shown in FIGS. 28 and 29. It can be seen that the rupture lives of the alloys of the present invention are up to 2 times longer than Alloy R' N6 (U.S. Pat. No. 5,270,123 issued Dec. 14, 1993) at 2000° F. and up to 3 times longer at 2100° F. When this 2100° F. rupture data is compared to the corresponding 2100° F. rupture life of Alloy R' N5, used as High Pressure Turbine (HPT) blading in the Advanced F110 military engine family, the temperature capability advantage of the present invention is almost 100° F., which would offer a significant performance advantage. It is judged that these improved strengths are achieved by the addition of Ru in combination with other strengthening elements, such as Re, Mo and W. Further, by enhancing microstructural stability, Ru can allow higher levels of the more potent strengtheners such as Mo, W and Re to participate in alloy strengthening instead of being tied up in detrimental TCP phases.

Analysis of the prior art alloys indicates that, although an optional range of Ru has been listed, none of the alloys require Ru in the composition, unlike the alloys of the present invention. The prior art alloys do not identify the critical range of elements required by the present invention to provide the combination of microstructural stability and high stress rupture strength in the presence of the elements Re, Ta, W, Al, Ti, Mo, Cb, Co and Cr. Furthermore, the prior art, in discussing alloys, do not recognize the role of Ru in causing the reverse partitioning effect of Ti and Al to the gamma phase and Re, Cr and W to the gamma prime phase. Ni-base superalloys containing Ru and exhibiting such behavior are termed Ruthenium-containing Reverse Partitioning Ni-base superalloys, or simply Reverse Partitioning Ni-base superalloys.

In a preferred embodiment of the present invention, a nickel base superalloy single crystal article has an improved combination of stress rupture life and microstructural stability. Detrimental formation of topologically close packed phases in the superalloy microstructure at elevated temperatures is minimized. The superalloy single crystal article is characterized by a specific combination of Ru with a first group of elements consisting of Mo, Cr and Cb in a first range defined by their sum in atomic percent, and a second group of elements consisting of Al, Ti and W in a second range defined by their sum in atomic percent, wherein the composition of the article is, 0.25%–2.0% (about 0.6–3.0 weight %) Ru, 1.4–2.0% (about 4.2–6.0 weight %) Re, 0.4–1.5% (about 0.6–2.4 weight %) Mo, 2.2–3.0% (about 6.3–8.7 weight %) Ta, the sum of the first range is 1.9–7.5%, 4.0–16.0% Co, 0–0.16% Hf, 0–0.3% C, 0–0.05% B, 0–0.03% Y, 1.5–7.2% Cr, 0–0.3% Cb, 12.0–15.0% Al, 0–1.3% Ti, 1.0–2.3% W and wherein the sum of the second range is 13.5–17.2%, balance nickel and incidental impurities.

In a more preferred embodiment of the present invention, a nickel base superalloy single crystal article has an improved combination of stress rupture life and microstructural stability. Detrimental formation of topologically close packed phases in the superalloy microstructure at elevated temperatures is again minimized. The superalloy single crystal article is characterized by a specific combination of Ru with a first group of elements consisting of Mo, Cr and Cb in a first range defined by their sum in atomic percent, and a second group of elements consisting of Al, Ti and W in a second range defined by their sum in atomic percent, wherein the composition of the article is, 0.4%–2.0% (about 0.6–3.0 weight %) Ru, 1.5–1.95% (about 4.5–5.75 weight %) Re, 0.4–1.5% (about 0.5–2.4 weight %) Mo, 2.4–2.9% (about 6.9–8.5 weight %) Ta, the sum of the first range is 2.25–7.25%, 4.0–16.0% Co, 0–0.16% Hf, 0–0.3% C, 0–0.05% B, 0–0.03% Y, 2.0–7.0% Cr, 0–0.3% Cb, 12.75–14.2% Al, 0–1.3% Ti, 1.0–2.3% W and wherein the sum of the second range is 14.0–16.25%, balance nickel and incidental impurities.

In another preferred embodiment, a nickel base superalloy single crystal article has an improved combination of stress rupture life and microstructural stability. Detrimental formation of topologically close packed phases in the superalloy microstructure at elevated temperatures is again minimized. The superalloy single crystal article is characterized by a specific combination of Ru with a first group of elements consisting of Mo, Cr and Cb in a first range defined by their sum in atomic percent, and a second group of elements consisting of Al, Ti and W in a second range defined by their sum in atomic percent, wherein the composition of the article is, 0.5 –2.0% (about 0.8–3.0 weight %) Ru, 1.5–1.95% (about 4.5–5.75 weight %) Re, 0.6–1.25% (about 0.9–2.0 weight %) Mo, 2.2–2.75% (about 6.4–8.1 weight %) Ta, the sum of the first range is 4.0–7.2%, 4.0–16.0% Co, 0–0.16% Hf, 0–0.3% C, 0–0.05% B, 0–0.03% Y, 2.4–6.0% Cr, 0–0.3% Cb, 12.9–14.0% Al, 0–1.3% Ti, 1.0–2.3% W and wherein the sum of the second range is 15.0–16.25%, balance nickel and incidental impurities. The elements C, B and Hf are small, intentional, measurable additions included to develop specific properties. C is added to allow for a cleaner melting alloy and to aid in promoting corrosion resistance. Hf is added to improve the oxidation resistance of the alloy and to improve its coating compatibility and life. Boron improves the alloy's tolerance for low angle grain boundary defects.

The above described testing and data has identified that 1) Ru retards the formation of TCP phases after high temperature exposure; 2) Ru is an order of magnitude less detrimental to SRZ formation compared to Re; 3) an alloy similar to alloy R' N6 with the addition of Ru, for example in the specifically preferred range of about 0.25–2.0 at. % Ru, provided about a 25 degree F. improvement in stress rupture capability.

EXAMPLE 5

A superalloy article was prepared. The nominal composition of the article, in atomic percent, was about 0.5% Ru, about 0.6% Mo, about 1.8% Re, about 13.8% Al, about 6.0% Cr, about 2.7% Ta, about 13.3% Co, about 1.9% W, about 0.26% C, about 0.05% Hf, about 0.02% B, about 0.0004% Y, wherein the sum of the first range is 6.5–6.7% and the sum of the second range is 15.6–15.8%, balance nickel and incidental impurities. This article composition corresponds to Alloy 5 of Table 1. As indicated in FIG. 29, this alloy displays improved stress rupture performance at elevated temperatures, and does not form detrimental TCP after long exposures to elevated temperatures.

EXAMPLE 6

A superalloy article was prepared. The nominal composition of the article, in atomic percent, was about 1.0% Ru, about 1.0% Mo, about 1.5% Re, about 13.8% Al, about 6.0% Cr, about 2.2% Ta, about 13.3% Co, about 1.9% W, about 0.26% C, about 0.05% Hf, about 0.02% B, about 0.0004 Y, wherein the sum of the first range is 6.9–7.1% and the sum of the second range is 15.6–15.8%, balance nickel and incidental impurities. This article composition corresponds to Alloy 11 of Table 1. As indicated in FIGS. 28 and 29, this alloy displays improved stress rupture performance at elevated temperatures, and does not form detrimental TCP after long exposures to elevated temperatures.

EXAMPLE 7

A superalloy article was prepared. The nominal composition of the article, in atomic percent, was about 0.75% Ru, about 0.9% Mo, about 1.95% Re, about 13.8% Al, about 4.75% Cr, about 2.7% Ta, about 13.3% Co, about 2.15% VV, about 0.26% C, about 0.05% Hf, about 0.02% B, about 0.0004 Y, wherein the sum of the first range is 5.5–5.8% and the sum of the second range is 15.8–16.1%, balance nickel and incidental impurities. This article composition corresponds to Alloy 22 of Table 1. This alloy displays improved stress rupture performance at elevated temperatures, and does not form detrimental TCP after long exposures to elevated temperatures.

The addition of Ru to Ni- base superalloys to affect the gamma and gamma prime phase chemistry in order to control the partitioning of elements to these phases, thus inhibiting the formation of undesirable TCP phases was previously unknown and is an important aspect of the present invention. Ru is the only refractory element which, when added to Ni-base alloys of the present invention, does not cause instability due to TCP formation. Furthermore, the addition of Ru to Ni-base superalloys within the compositional limits of the present invention unexpectedly causes the partitioning of Al and optional Ti to the gamma phase away from the gamma prime phase. Re which normally partitions to the gamma phase, is partitioned to the gamma prime phase in the alloys of the present invention. Cr and VV, which partitions to the gamma phase and to a lesser extent to the gamma prime phase, partition from the gamma phase to the gamma prime phase in the alloys of the present invention. This behavior is contrary to all prior teachings as to the behavior of these elements in Ni-base superalloys. Because of this behavior, the alloys of the present invention are referred to as Reverse Partitioning Ni-base superalloys.

As used herein, the nominal composition of an alloy is defined to mean the specific defined chemistry used as a target by the master alloy melter which includes the variation of this composition recognized as melt tolerance in reproducing this target chemistry.

Although the present invention has been described in connection with specific examples and embodiments, those skilled in the art will recognize that the present invention is capable of other variations and modifications within its scope. These examples and embodiments are intended as typical of, rather than in any way limiting on, the scope of the present invention as presented in the appended claims.

We claim:

1. A nickel base superalloy single crystal article having an improved combination of stress rupture life and microstructural stability and which minimizes the detrimental formation of topologically close packed phases in the superalloy microstructure at elevated temperatures, the superalloy single crystal article characterized by a specific combination of Ru with a first group of elements consisting of Mo, Cr and Cb in a first range defined by their sum in atomic percent, and a second group of elements consisting of Al, Ti and w in a second range defined by their sum in atomic percent, the composition of the superalloy article consisting essentially of, in atomic percent:

about 0.25–4.0% (about 0.4–6.5 weight %) Ru, in combination with about 1.5–1.95% (about 4.5–5.75 weight %) Re, about 2.0–3.7% (about 5.8–10.7 weight %) Ta, about 4.0–16.0% (about 4.25–17.0 weight %) Co, about 0–0.16% (about 0–0.05 weight %) Hf, about 0–0.03% (about 0–0.06 weight %) C, 0–0.05% (about 0–0.01 weight % ) B, about 0–0.03% (about 0–0.02 weight % ) Y, 0.6–1.25% (about 0.9–2.0 weight %) Mo, about 1.5–7.2% (about 1.25–6.0 weight %) Cr, about 0–0.7% (about 0–1.0 weight %) Cb, 12.0–15.0% (about 5.0–6.6 weight %) Al, about 0–1.3% (about 0–1.0 weight %) Ti, about 1.0–2.5% (about 3.0–7.5 weight %) W, wherein the sum of the first range, defined by the first group of elements consisting of Mo+Cr+Cb, is about 1.5–8.0%, and wherein the sum of the second range, defined by the second group of elements consisting of Al+Ti+W, is about 13.5–17.2%, the balance Ni and incidental impurities.

2. The superalloy article of claim 1 wherein, in atomic percent, Ru is about 0.5–2.0% (about 0.8–3.0 weight %), Al is about 12.9–14.0% (about 5.5 to 6.1 weight %), Cr is about 2.4–6.0% (about 2.0–5.0 weight %), Ta is about 2.2–2.75% (about 6.4–8.1 weight %), the sum of the first range is about 4.0–7.2% and the sum of the second range is about 15.0–16.25%.

3. The superalloy article of claim 2 wherein the nominal composition, in atomic percent, is about 0.5% (about 0.8 weight %) Ru, about 0.6% (about 0.95 weight %) Mo, about 1.8% (about 5.4 weight %) Re, about 13.8% (about 6.0 weight %) Al, about 6.0% (about 5.0 weight %) Cr, about 2.7% (about 7.9 weight %) Ta, about 13.3% (about 12.6 weight %) Co, about 1.9% (about 5.65 weight %) W, about 0.26% (about 0.05 weight C, about 0.05% (about 0.15 weight %) Hf, about 0.02% (about 0.004 weight %) B, about 0.0004% (about 0.0005 weight %) Y, wherein the sum of the first range is 6.5–6.7% and the sum of the second range is 15.6–15.8%, balance nickel and incidental impurities.

4. The superalloy article of claim 2 wherein the nominal composition, in atomic percent, is about 1.0% (about 1.6 weight %) Ru, about 1.0% (about 1.55 weight %) Mo, about 1.5% (about 4.5 weight %) Re, about 13.8% (about 6.0 weight %) Al, about 6.0% (about 5.0 weight %) Cr, about 2.2% (about 6.4 weight %) Ta, about 13.3% (about 12.6 weight %) Co, about 1.9% (about 5.65 weight %) W, about 0.26% (about 0.05 weight C, about 0.05% (about 0.15 weight %) Hf, about 0.02% (about 0.004 weight %) B, about 0.0004 (about 0.0005 weight %) Y, wherein the sum of the first range is 6.9–7.1% and the sum of the second range is 15.6–15.8%, balance nickel and incidental impurities.

5. The superalloy article of claim 2 wherein the nominal composition, in atomic percent, is about 0.75% (about 1.2 weight %) Ru, about 0.9% (about 1.4 weight %) Mo, about 1.95% (about 5.75 weight %) Re, about 13.8% (about 6.0 weight %) Al, about 4.75% (about 3.9 weight %) Cr, about 2.7% (about 7.75 weight %) Ta, about 13.3% (about 12.6 weight %) Co, about 2.15% (about 6.3 weight %) W, about 0.26% (about 0.05 weight %) C, about 0.05% (about 0.15 weight %) Hf, about 0.02% (about 0.004 weight %) B, about 0.0004 (about 0.0005 weight %) Y, wherein the sum of the first range is 5.5–5.8% and the sum of the second range is 15.8–16.1%, balance nickel and incidental impurities.

6. A nickel base superalloy single crystal article having an improved combination of stress rupture life and microstructure stability and which minimizes the detrimental formation of topologically close packed phases in the superalloy microstructure at elevated temperatures, the superalloy single crystal article characterized by a specific combination of Ru with a first group of elements consisting of Mo, Cr and Cb in a first range defined by their sum in atomic percent, and a second group of elements consisting of Al, Ti and W in a second range defined by their sum in atomic percent, the composition of the superalloy article consisting essentially of, in atomic percent:

about 0.25–4.0% Ru, in combination with about 1.5–1.95% Re, about 2.0–3.7% Ta, about 4.0–16.0% Co, about 0–0.16% Hf, about 0–0.3% C, about 0–0.05% B, about 0–0.03% Y, about 0.6–1.25% Mo, about 1.5–7.2%, Cr, about 0–0.3% Cb, about 12.0–15.0%Al, about 0–1.3% Ti, about 1.0–2.3% W, wherein the sum of the first range, defined by the first group of elements consisting of Mo+Cr+Cb, is about 1.5–8.0% , and wherein the sum of the second range, defined by the second group of elements consisting of Al+Ti+W, is about 13.5–17.2%, the balance Ni and incidental impurities; and wherein the alloy is characterized by a stress rupture life of at least about 360 hours under a stress in the range of at least about 11–18 ksi at a temperature in the range of about 2000° F.–2100° F.

7. The superalloy article of claim 6 wherein the alloy is characterized by a stress rupture life of at least about 600 hours under a stress of at least about 12 ksi at a temperature of at least about 2100° F., the alloy further having a TCP number of 3 or less.

8. The article of claim 8 wherein the article is an airfoil for a gas turbine engine.

9. The article of claim 8 further including a surface coated with a metal selected from the group consisting of Al, Pt and alloys of Al and Pt, the alloy characterized by a reduced tendency to form SRZ, wherein the relationship between the amount of SRZ formation and composition is $$[SRZ]^{1/2}=-7.59+14.41 (\% Re)+1.88 (\% W)+1.65 (\% Ru)-3.52 (\% Cr)-2.33 (\% Mo).$$

* * * * *

UNITED STATES PATENT AND TRADEMARK OFFICE
CERTIFICATE OF CORRECTION

PATENT NO. : 5,482,789
DATED : JANUARY 9, 1996
INVENTOR(S) : KEVIN S. O'HARA, et al.

It is certified that error appears in the above-identified patent and that said Letters Patent is hereby corrected as shown below:

Col. 1, line 22, delete "Icad" and insert therefor --load--;
      line 29, delete "Icad" and insert therefor --load--; and
      line 46, delete "GE PROPRIETARY INFORMATION".

Col. 3, line 42, after "0-1.3", insert --%-- and close up lines 42 and 43.

Col. 11, line 47, insert --EXAMPLE 1--.

Col. 12, line 25, insert --EXAMPLE 2--; and
      line 46, insert --EXAMPLE 3--.

Col. 13, line 1, insert --EXAMPLE 4--.

Col. 18, line 53, after "0.5", insert --%-- and close up lines 53 and 54.

Col. 19, line 44, delete "VV" and insert therefor --W--; and
      line 67, delete "VV" and insert therefor --W--.

Col. 20, Cl. 1, line 27, delete "w" and insert therefor --W--;
      line 36, delete "0-0.03% and insert --0-0.3%--; and
      line 38, after "Y," insert --about--.
    Cl. 3, line 63, after "0.05 weight", insert -- %)--.

Col. 21, Cl. 4, line 8, after "0.05 weight", insert -- %)--.

Signed and Sealed this

Second Day of July, 1996

BRUCE LEHMAN

*Attest:*

*Attesting Officer*     *Commissioner of Patents and Trademarks*